(12) United States Patent
Callaghan

(10) Patent No.: US 11,062,774 B2
(45) Date of Patent: Jul. 13, 2021

(54) INTELLIGENT FLASH REPROGRAMMING

(71) Applicant: Microsoft Technology Licensing, LLC, Redmond, WA (US)

(72) Inventor: David Michael Callaghan, Redmond, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 15/075,006

(22) Filed: Mar. 18, 2016

(65) Prior Publication Data
US 2016/0372203 A1  Dec. 22, 2016

Related U.S. Application Data

(63) Continuation of application No. 13/093,565, filed on Apr. 25, 2011, now Pat. No. 9,324,433.

(51) Int. Cl.
| | | |
|---|---|---|
| G06F 12/00 | (2006.01) | |
| G06F 12/08 | (2016.01) | |
| G06F 13/00 | (2006.01) | |
| G11C 16/10 | (2006.01) | |
| G11C 16/26 | (2006.01) | |
| G11C 29/36 | (2006.01) | |

(Continued)

(52) U.S. Cl.
CPC .......... *G11C 16/10* (2013.01); *G11C 16/26* (2013.01); *G11C 29/36* (2013.01); *G11C 29/38* (2013.01); *G11C 29/50004* (2013.01); *G11C 2029/5004* (2013.01)

(58) Field of Classification Search
CPC ..... G06F 2221/0748; G06F 2221/0771; G06F 3/0601; G06F 3/061; G06F 3/064; G06F 11/0745; G06F 11/076; G06F 11/0793; G06F 11/1028; G06F 11/106
USPC .................................. 711/103; 365/118–223
See application file for complete search history.

(56) References Cited

U.S. PATENT DOCUMENTS 5,724,285 A   3/1998  Shinohara
5,835,413 A  11/1998  Hurter et al.
(Continued)

OTHER PUBLICATIONS

Cai et al., "Flash Correct-and-Refresh: Retention-Aware Error Management for Increased Flash Memory Lifetime," *In Proceedings of IEEE 30th International Conference on Computer Design*, Sep. 30, 2012, pp. 94-101.

(Continued)

*Primary Examiner* — Mohamed M Gebril
(74) *Attorney, Agent, or Firm* — Klarquist Sparkman, LLP

(57) ABSTRACT

Apparatus, methods, and computer-readable media for programming, reading, and servicing non-volatile storage device to improve data retention time and data density are disclosed. According to one embodiment, a method of managing a non-volatile memory storage device includes generating output values based on an expected pattern of discrete states stored in memory cells of the storage device, comparing output values for the memory cells to expected output values using a pre-selected threshold, and based on the comparing, programming other memory cells of the storage device to refresh the programming of the other memory cells. Methods of performing service and management operations for interrupting a host system coupled a non-volatile memory storage device are also disclosed.

29 Claims, 11 Drawing Sheets

(51) Int. Cl.
*G11C 29/38* (2006.01)
*G11C 29/50* (2006.01)

(56) References Cited

U.S. PATENT DOCUMENTS

| | | | | |
|---|---|---|---|---|
| 5,847,991 A * | 12/1998 | Tong | | G11C 11/5621 |
| | | | | 365/185.03 |
| 5,909,449 A | 6/1999 | So et al. | | |
| 6,462,995 B2 | 10/2002 | Urakawa | | |
| 6,504,773 B2 | 1/2003 | Kobayashi | | |
| 6,522,586 B2 | 2/2003 | Wong | | |
| 6,763,424 B2 * | 7/2004 | Conley | | G06F 12/0246 |
| | | | | 365/185.11 |
| 6,779,136 B2 | 8/2004 | Richter et al. | | |
| 7,162,674 B2 | 1/2007 | Nozuyama | | |
| 7,236,000 B1 * | 6/2007 | Steiner | | H03K 19/0033 |
| | | | | 326/10 |
| 7,254,691 B1 * | 8/2007 | Ebeling | | G06F 12/0646 |
| | | | | 341/100 |
| 7,325,090 B2 * | 1/2008 | Ronen | | G11C 11/406 |
| | | | | 711/103 |
| 7,334,159 B1 | 2/2008 | Callaghan | | |
| 7,397,697 B2 | 7/2008 | So et al. | | |
| 7,441,067 B2 | 10/2008 | Gorobets et al. | | |
| 7,444,563 B2 * | 10/2008 | Hazama | | G06F 11/1072 |
| | | | | 365/201 |
| 7,535,787 B2 * | 5/2009 | Elmhurst | | G11C 16/3418 |
| | | | | 365/185.09 |
| 7,542,344 B2 * | 6/2009 | Kim | | G11C 11/5628 |
| | | | | 365/185.03 |
| 7,580,277 B2 * | 8/2009 | Fuji | | G11C 11/406 |
| | | | | 365/148 |
| 7,711,890 B2 * | 5/2010 | Lasser | | G11C 11/5628 |
| | | | | 711/103 |
| 7,788,553 B2 | 8/2010 | Chow et al. | | |
| 7,876,621 B2 | 1/2011 | Sharon et al. | | |
| 7,903,467 B2 | 3/2011 | Lee | | |
| 7,945,825 B2 * | 5/2011 | Cohen | | G11C 16/3404 |
| | | | | 714/721 |
| 8,031,521 B1 * | 10/2011 | Yang | | G11C 16/06 |
| | | | | 365/185.02 |
| 8,031,522 B2 * | 10/2011 | Jang | | G11C 11/5671 |
| | | | | 365/185.03 |
| 8,595,449 B2 * | 11/2013 | Kund | | G11C 7/04 |
| | | | | 711/154 |
| 8,645,793 B2 | 2/2014 | Wu et al. | | |
| 8,897,066 B2 * | 11/2014 | Jung | | G11C 16/0483 |
| | | | | 365/185.03 |
| 8,938,655 B2 * | 1/2015 | Hamilton | | G11C 16/3431 |
| | | | | 714/763 |
| 9,070,453 B2 * | 6/2015 | Sharon | | G11C 16/102 |
| 9,116,791 B2 | 8/2015 | Agami | | |
| 9,324,433 B2 | 4/2016 | Callaghan | | |
| 9,847,122 B2 * | 12/2017 | Choi | | G11C 16/06 |
| 2003/0177300 A1 | 9/2003 | Lee et al. | | |
| 2004/0047182 A1 * | 3/2004 | Cernea | | G11C 16/3427 |
| | | | | 365/185.03 |
| 2004/0090853 A1 * | 5/2004 | Perner | | G11C 8/18 |
| | | | | 365/222 |
| 2005/0157746 A1 | 7/2005 | Horpestad | | |
| 2005/0283566 A1 | 12/2005 | Callaghan | | |
| 2006/0050314 A1 * | 3/2006 | Shiga | | G11C 16/102 |
| | | | | 358/1.16 |
| 2006/0080501 A1 * | 4/2006 | Auerbach | | G11B 19/02 |
| | | | | 711/112 |
| 2007/0133331 A1 * | 6/2007 | Park | | G11C 11/40622 |
| | | | | 365/222 |
| 2007/0183196 A1 * | 8/2007 | Gendrier | | G11C 16/3431 |
| | | | | 365/185.03 |
| 2007/0263444 A1 | 11/2007 | Gorobets | | |
| 2008/0055997 A1 | 3/2008 | Lee | | |
| 2008/0082725 A1 | 4/2008 | Elhamias | | |
| 2008/0082736 A1 * | 4/2008 | Chow | | G06F 12/0246 |
| | | | | 711/103 |
| 2008/0094893 A1 * | 4/2008 | Choi | | G11C 11/5628 |
| | | | | 365/185.03 |
| 2008/0109598 A1 * | 5/2008 | Schakel | | G11C 5/02 |
| | | | | 711/106 |
| 2008/0137415 A1 * | 6/2008 | Lee | | G11C 11/5628 |
| | | | | 365/185.03 |
| 2008/0304327 A1 * | 12/2008 | Elmhurst | | G11C 16/3418 |
| | | | | 365/185.25 |
| 2009/0113119 A1 * | 4/2009 | Oribe | | G06F 12/0804 |
| | | | | 711/103 |
| 2009/0119444 A1 * | 5/2009 | Davis | | G06F 11/1008 |
| | | | | 711/103 |
| 2009/0144583 A1 * | 6/2009 | Bruennert | | G11C 29/44 |
| | | | | 714/6.32 |
| 2009/0161466 A1 * | 6/2009 | Hamilton | | G11C 16/10 |
| | | | | 365/222 |
| 2009/0265598 A1 | 10/2009 | Lasser | | |
| 2010/0169551 A1 | 7/2010 | Yano et al. | | |
| 2010/0188915 A1 | 7/2010 | Ahn | | |
| 2010/0293420 A1 * | 11/2010 | Kapil | | G06F 12/0815 |
| | | | | 714/710 |
| 2010/0301896 A1 * | 12/2010 | Nirschl | | H01L 27/2481 |
| | | | | 326/8 |
| 2011/0145485 A1 * | 6/2011 | Chun | | G06F 12/0246 |
| | | | | 711/103 |
| 2012/0099389 A1 * | 4/2012 | Park | | G11C 29/808 |
| | | | | 365/200 |
| 2012/0218818 A1 | 8/2012 | Han et al. | | |
| 2012/0239860 A1 | 9/2012 | Atkisson et al. | | |
| 2012/0246392 A1 * | 9/2012 | Cheon | | G06F 12/0638 |
| | | | | 711/103 |
| 2014/0059405 A1 | 2/2014 | Syu et al. | | |
| 2015/0262697 A1 | 9/2015 | Kim | | |

OTHER PUBLICATIONS

"Non-Final Office Action Issued in U.S. Appl. No. 13/093,565", dated Jan. 4, 2013, 30 Pages.
"Non-Final Office Action Issued in U.S. Appl. No. 13/093,565", dated Jul. 19, 2013, 28 Pages.
"Final Office Action Issued in U.S. Appl. No. 13/093,565", dated Feb. 13, 2014, 30 Pages.
"Non-Final Office Action Issued in U.S. Appl. No. 13/093,565", dated Jul. 21, 2014, 30 Pages.
"Final Office Action Issued in U.S. Appl. No. 13/093,565", dated Feb. 12, 2015, 33 Pages.
"Notice of Allowance Issued in U.S. Appl. No. 13/093,565", dated Dec. 23, 2015, 16 Pages.
"SSD Performance Secrets," downloaded from http://agigatech.com/blog/ssd-performance-secrets/, 6 pages (document marked Dec. 18, 2009).
ARM Ltd., "Memory Organization," *RL-ARM User's Guide*, downloaded from http://www.keil.com/support/man/docs/rlarm/rlarm_fs_mem_org.html, 2 pages (document marked 2011).
Integrated Circuit Engineering Corp., "ROM, EPROM, and EEPROM Technology," downloaded from http://smithsonianchips.si.edu/ice/cd/MEMORY97/SEC09.PDF, 15 pages. (document not dated, downloaded on Apr. 26, 2011).
Jurenka, "Exploring Managed NAND Media Endurance," Thesis, Boise State University, 69 pages (May 2010).
Mehnert, "Managing flash memory with intelligence," *Industrial Embedded Systems*, downloaded from http://industrial-embedded.com/managing-flash-memory-intelligence, 5 pages (document marked Mar. 25, 2008).
Roger, STMicroelectronics, "AN1496 Application Note," downloaded from http://www.st.com/stonline/books/pdf/docs/8629.pdf, 16 pages (Feb. 2002).
SanDisk, "SanDisk MultiMediaCard and Reduced-Size MultiMediaCard," v. 1.3, 91 pages (Apr. 2005).
Wikipedia, "Common Flash Memory Interface," downloaded from http://en.wikipedia.org/wiki/Flash_memory_controller, 2 pages (document marked Nov. 2010).
Wikipedia, "ECC," http://en.wikipedia.org/wiki/ECC, 2 pages (document marked Apr. 2011).

(56) References Cited

OTHER PUBLICATIONS

Wikipedia, "Flash memory controller," http://en.wikipedia.org/wiki/Flash_memory_controller, 2 pages (document marked Mar. 2011).
Wikipedia, "Forward error correction," http://en.wikipedia.org/wiki/Error-correcting_code, 6 pages (document marked Apr. 2011).
Wikipedia, "Solid-state drive," downloaded from http://en.wikipedia.org/wiki/Solid-state_drive, 18 pages (document marked Apr. 2011).

* cited by examiner

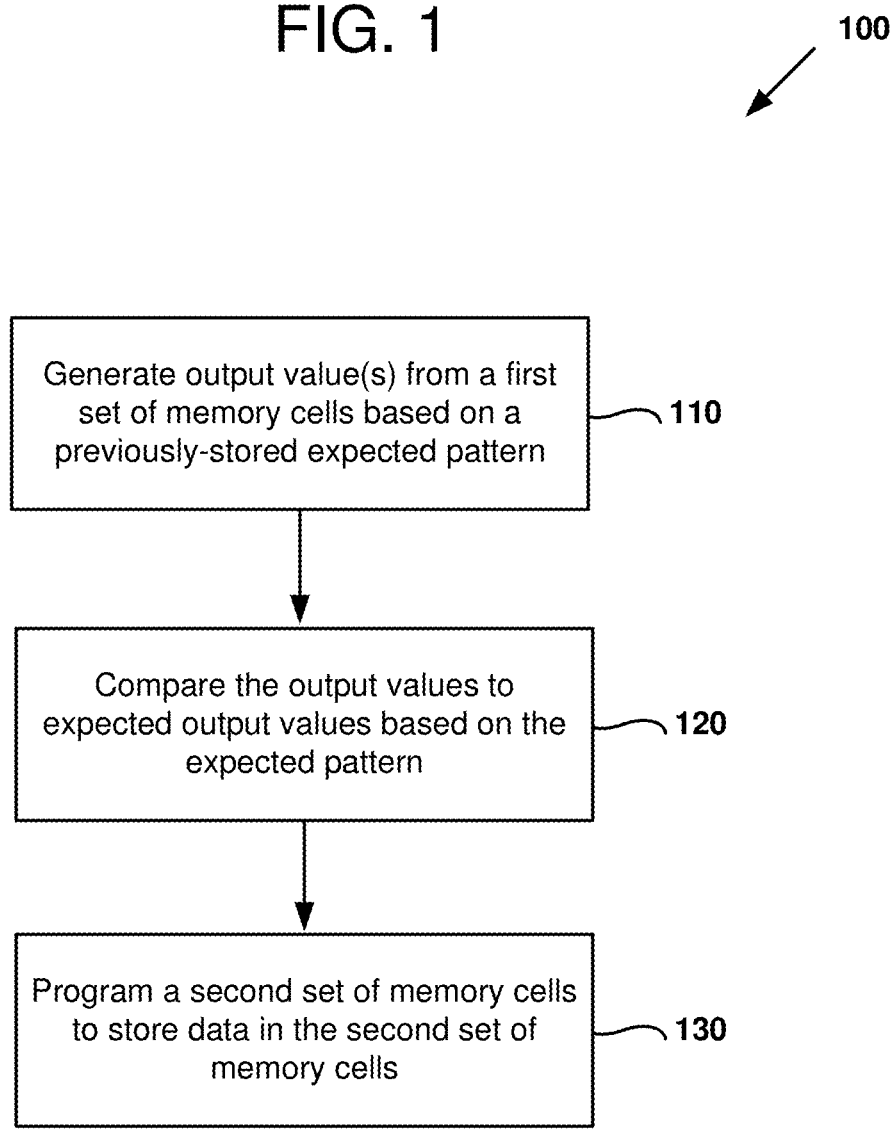

FIG. 10
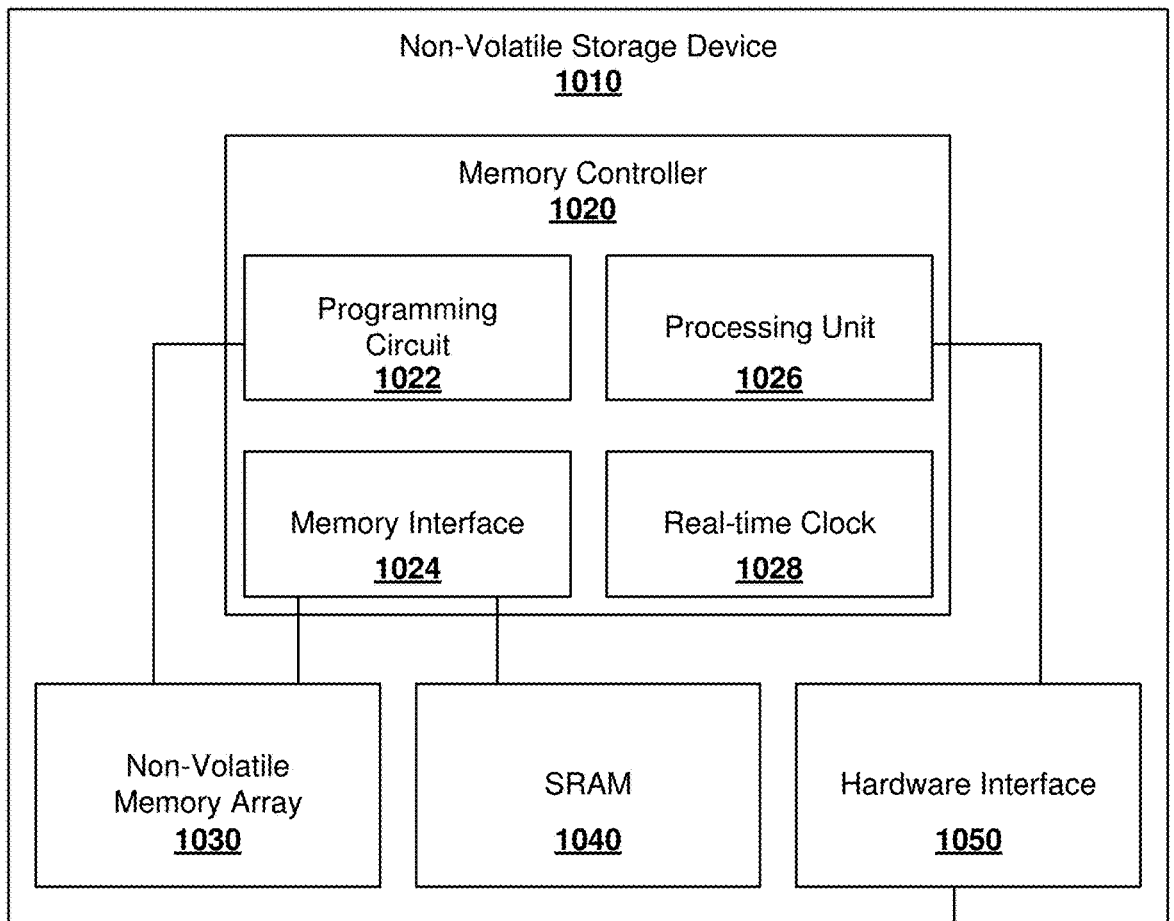
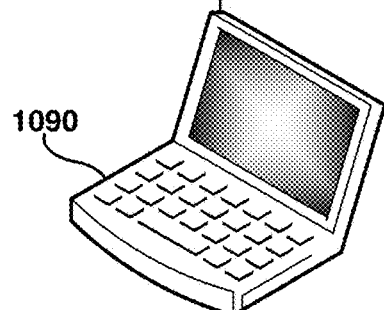

INTELLIGENT FLASH REPROGRAMMING

CROSS-REFERENCE TO RELATED APPLICATIONS

This a continuation of U.S. application Ser. No. 13/093,565, filed Apr. 25, 2011, now U.S. Pat. No. 9,324,433, issued Apr. 26, 2016, which application is incorporated by reference in its entirety as if set forth fully herein.

FIELD

The present disclosure pertains to apparatus and methods for using storage devices incorporating non-volatile memory, including programming, reading, and servicing of such devices.

BACKGROUND

Non-volatile memory technologies, including Flash memory (e.g., NOR- and NAND-type flash memory), EEPROM (Electrically Erasable Programmable Read Only Memory), FRAM (Ferroelectric Random Access Memory), MRAM (Magneto-resistive Random Access Memory), PRAM (Phase Change Random Access Memory), and bubble memory can be used to store data (including computer-executable instructions) in everyday computing devices. Once programmed, non-volatile memories have a common property of being able to retain data for relatively long durations of time without being powered. However, all non-volatile memories still tend to eventually lose their stored programmed data. For example, depending on the technology used to implement flash memory cells, reliable data storage durations can range from 2-3 years, up to 10 years.

SUMMARY

The present application discloses apparatus, articles of manufacture, and methods for programming test patterns of data and date/time information when storing data in non-volatile memory (e.g., flash memory) of a non-volatile storage device (e.g., a flash memory "stick" or a solid-state drive). In some examples, a non-volatile storage device stores computer-executable instructions (e.g., firmware) that can compare date information when all or a portion of memory cells in a non-volatile memory are programmed. If the date (when at least a portion of the memory cells were programmed) exceeds a service life for data stored in the memory cells, those memory cells, or other memory cells in the storage device, can be reprogrammed. This reprogramming refreshes the data stored in the memory cells, further extending the duration for which the data can be reliably retrieved. In some examples, reprogramming of the memory cells can be coordinated with service and/or maintenance event notifications initiated by the non-volatile storage device and/or a host computer coupled to the non-volatile storage device.

Apparatus, articles of manufacture, and methods disclosed herein can be used to reprogram non-volatile memory before data stored in the memory is lost. In some examples, non-volatile memory can be managed using a microcontroller, processor, or other logic included with a non-volatile storage device. In some examples, non-volatile memory can be managed using an external computer, such as a host PC, mobile device, smart phone, or other suitable devices coupled with a non-volatile storage device. In some examples, the density of bits stored per memory cell can be increased, as using embodiments of the disclosed techniques for service, maintenance, and/or reprogramming of memory cells can improve the reliability of the non-volatile memory relative to techniques that rely on stored data to remain readable throughout a specified lifecycle, without maintenance.

In some examples of the disclosed technology, non-volatile storage devices (e.g., a flash memory storage device) can store multiple bits of data per memory cell by storing differing amounts of charge in a cell to represent different discrete states. When the memory cell is read, an output value (e.g., read as a cell voltage, current, or other suitable electrical property) is measured to determine a discrete output state for the cell. For example, 1-bit memory cells can be programmed such that an output voltage of 0 to 0.5 Volts represents a logic 0 bit, and anything higher than a threshold of 0.5 V (e.g., any voltage output value between 0.5 V and a maximum of output value of 5 V) represents a logic 1 bit. In some examples of flash memory, blocks of bits are erased to output logic 1 bits, and then individual memory cells can be programmed such that their corresponding voltage output level is below 0.5 volts (e.g., logic 0 bits).

In multi-bit memory cells, more than two voltage ranges can be used to represent logic values. For example, in a 2-bit memory cell with voltage output values varying between 0 and 4 Volts, output values could be encoded such that 0-1 V represents 00b (0 decimal), 1-2 V represents 01b (1 decimal), 2-3 V represents 10b (2 decimal), and 3-4 V represents 11b (3 decimal). However, because the memory cells in certain non-volatile storage devices, such as flash memory, tend to lose charge over time, the duration during which data can be reliably stored in a known voltage state is reduced over a comparable 1-bit memory, because the range of the voltage output levels is narrower and thus more susceptible to read errors caused by device variation and loss of storage charge over time.

Therefore, the memory cells of a multi-bit memory array should be recharged and reprogrammed more frequently to avoid data loss. However, memory cells of a non-volatile memory also tend to "wear down" with each subsequent reprogramming, until the cells are no longer able to reliably store charge for a specified duration of time. Thus, excessive reprogramming of non-volatile memory cells should generally be avoided. By storing a number of test patterns, data information, other information regarding discrete states stored in a non-volatile storage device, and/or date information indicating when that data is stored in the non-volatile storage device, data retention times can be improved, additional bits can be stored per memory cell, and/or specified storage lifetimes for memory cells can be increased.

In some examples of the disclosed technology, a method of managing memory cells storing data in a non-volatile memory device comprises generating one or more output values from a first set of memory cells of the non-volatile memory device being based on one or more values previously stored in the memory cells based on an expected pattern of one or more discrete states, comparing the output values to one or more expected output values based on the expected pattern using a pre-selected threshold, and based at least in part on the comparing, programming a second set of one or more memory cells of the non-volatile memory device to store the data in the second set of memory cells.

In some examples, a method of managing memory cells includes storing values based on the expected pattern of one or more discrete states in the first set of memory cells. In some examples, the expected pattern is independent of the stored data in the second set of memory cells. In some examples, the expected pattern is based on an error-correcting code (ECC) for the stored data in the second set of memory cells.

In some examples disclosed herein, generating output values comprises measuring an electrical property of at least one cell of a first set of cells. In some examples, expected output values are nominal output values expected to be generated by cells of a non-volatile memory device when programmed with an expected pattern.

In some examples disclosed herein, a non-volatile memory device includes one or more pages of physical memory, where a page of physical memory is the smallest unit of the non-volatile memory device that can be erased, the pages of physical memory include two or more sectors of physical memory, and each cell of a first set of cells is located in identically-addressed respective sectors relative to each respective page of physical memory included in a non-volatile memory device.

In some examples disclosed herein, a method further comprises generating a first set of output values and a second set of output values from a set of memory cells, the second output values being based on previously-stored values, and where comparing the values includes comparing the first output values, the second output values, a date associated with when the first output values were generated, a date associated with when the second output values were generated, and the expected output values using a pre-selected threshold.

In some examples disclosed herein, a pre-selected threshold is based on a tolerance value for an electrical property of the non-volatile memory device. In some examples disclosed herein, one or more computer-readable storage media store computer-readable instructions that when executed by a processor, cause the processor to perform one or more of the methods disclosed herein.

In some examples of the disclosed technology, a method of servicing a memory device coupled to a computing system includes determining whether to service a first unit of the memory device by evaluating a data pattern and one or more output values generated by reading one or more memory cells of a second unit of the memory device, the memory cells of the second set being previously programmed to store the data pattern, based on the determining, sending a first signal to the computing system indicating that the memory device is to be serviced, receiving a second signal from the computing system indicating that the memory device can be safely serviced, and based the receiving, servicing the memory device by restoring programming of one or more memory cells of the first unit.

In some examples disclosed herein, a method of servicing a memory device includes receiving system date information from the computing system, wherein the determining comprises comparing the system date information to date information associated with the second unit. In some examples, one or more of the output values are based on a voltage level output by at least one of the memory cells of the second unit.

In some examples disclosed herein, determining whether to service a memory device comprises determining a first timestamp indicating when the data pattern was stored in the second unit, determining a second timestamp indicating when data was stored in the first unit, and determining that at least one of the units is to be serviced by comparing the first timestamp and the second timestamp.

In some examples disclosed herein, a method of servicing a memory device includes receiving data to be stored in the memory device from the computing system, receiving a first timestamp from the computing system, and storing the received data in the first unit, the data pattern in the second unit, and the first timestamp in one or more of the memory cells. In some examples, a logical address for storing the received data in the first unit and a logical address for storing the data pattern in the second unit are not determined by the computing system.

In some examples of the disclosed technology, a storage device includes a memory array, a memory controller, and a hardware interface, wherein the memory array comprises one or more non-volatile memory cells, the hardware interface is operable to receive data to be stored in the memory cells from a computer system coupled to the hardware interface, and the memory controller is operable to maintain the received data when stored in the non-volatile memory cells using a method that includes storing the received data in at least one of the non-volatile memory cells, designated data cells, storing a data pattern in at least one of the non-volatile memory cells, designated pattern cells, reading an output value from at least one of the designated pattern cells, comparing the output value to an expected output value based on the data pattern using a pre-selected threshold, and if the comparing indicates that the pre-selected threshold is exceeded, maintaining the received data by repeating the storing of the received data.

In some examples, a method using a memory controller includes receiving date information representing a date associated with received data and storing at least a portion of the date information in a memory array, where comparing timestamps is based at least in part on the received date information.

In some examples, a method using a memory controller includes providing a first indication that the storage device will be in an inaccessible state, receiving a signal from a computing system coupled to the hardware interface indicating that the memory controller can proceed with the repeating the storing the received data, where the computing system generates the signal responsive to the provided indication, based on receiving the signal, repeating the storing of the received data, and after repeating the storing, providing a second indication that the storage device is not in the inaccessible state.

The foregoing and other objects, features, and advantages of the disclosed technology will become more apparent from the following detailed description, which proceeds with reference to the accompanying figures.

BRIEF DESCRIPTION OF THE DRAWINGS

FIG. 1 is a flow chart that outlines an exemplary implementation of the disclosed technology.

FIG. 10 is a block diagram that illustrates a non-volatile storage device, including a memory controller, non-volatile memory array, and a hardware interface, the storage device being coupled to a host computing system.

DETAILED DESCRIPTION

Figure 2A:
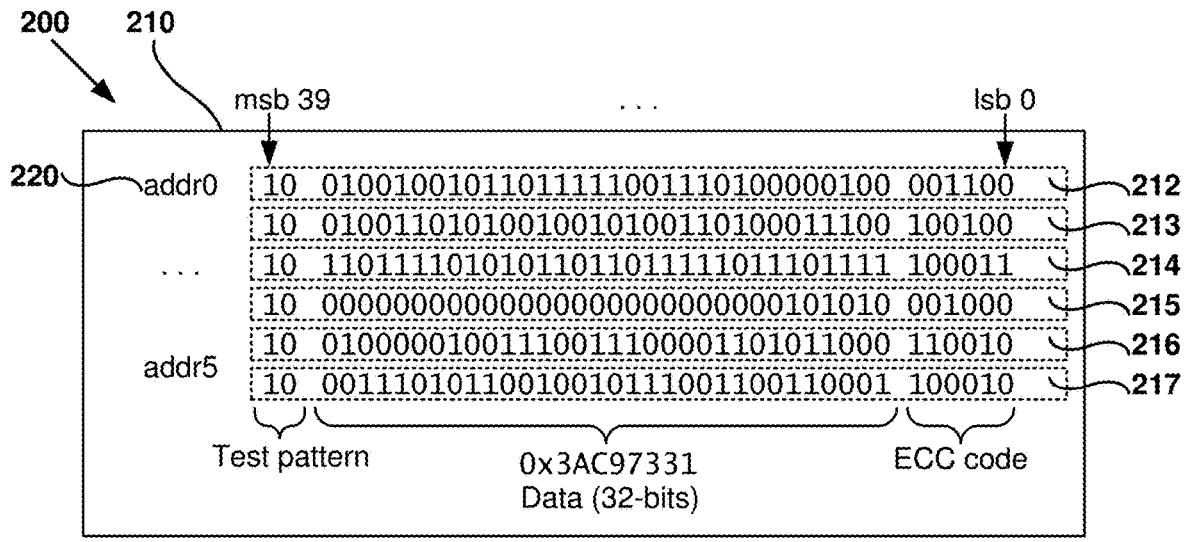
FIG. 2A is a diagram depicting data stored in a portion of a non-volatile memory in an exemplary implementation of the disclosed technology.

This disclosure is set forth in the context of representative embodiments that are not intended to be limiting in any way.

As used in this application and in the claims, the singular forms "a," "an," and "the" include the plural forms unless the context clearly dictates otherwise. Additionally, the term "includes" means "comprises."

The systems, methods, and apparatus disclosed herein should not be construed as being limiting in any way. Instead, this disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Furthermore, any features or aspects of the disclosed embodiments can be used in various combinations and sub-combinations with one another. Furthermore, as used herein, the term "and/or" means any one item or combination of items in the phrase.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged, omitted, or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce," "generate," "select," "measure," "search," and "provide" to describe the disclosed methods. These terms are high-level abstractions of the actual operations that are performed. The actual operations that correspond to these terms can vary depending on the particular implementation and are readily discernible by one of ordinary skill in the art.

Some of the disclosed methods can be implemented as computer-executable instructions stored on one or more computer-readable storage media (e.g., non-transitory computer-readable media, such as one or more volatile memory components (such as DRAM or SRAM), or nonvolatile memory components (such as flash memory or hard drives) and executed on a computer (e.g., any suitable computer, including smart phones or other mobile devices that include computing hardware). Any of the computer-executable instructions for implementing the disclosed techniques as well as any data created and used during implementation of the disclosed embodiments can be stored on one or more computer-readable media (e.g., non-transitory computer-readable media). The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in assembly language, C, C++, or any other suitable programming language. Likewise, the disclosed technology is not limited to any particular computer or type of hardware. Certain details of suitable computers and hardware are well-known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

Theories of operation, scientific principles, or other theoretical descriptions presented herein in reference to the systems, methods, and apparatus of this disclosure have been provided for the purposes of better understanding and are not intended to be limiting in scope. The systems, methods, and apparatus in the appended claims are not limited to those systems, methods, and apparatus that function in the manner described by such theories of operation.

Example Generation of Output Values Based on an Expected Pattern

FIG. 1 is a flow chart 100 that outlines an exemplary method of generating output values from a first set of memory cells based on a previously-stored expected pattern and programming a second set of memory cells based on a comparison of the output values and the expected pattern. In some examples, a non-volatile storage device includes a number of non-volatile memory arrays that include a number of memory cells, which are the basic storage units of the memory arrays. In some examples of non-volatile storage devices, a memory controller (e.g., a microcontroller or a microprocessor) is included for programming and reading data from the memory arrays. In some examples of non-volatile storage devices, an implementation of a hardware interface (e.g., a USB or CFI interface) is included for communicating with a host device (e.g., a PC or smartphone).

At process block 110, a number of output values are generated from a first set of memory cells storing an expected pattern of discrete states. Output values can be generated by measuring an output voltage of the memory cells. In other examples, voltage output values are not explicitly generated, but instead can be determined using a sense amplifier, comparator, or other suitable technology to generate discrete output values based on a pre-selected threshold. The pre-selected threshold can be based on a tolerance value for an electrical property of the non-volatile memory array. For example, a reference voltage (e.g., reference voltages $Y_R$ and $Y_{R1}$–$Y_{R3}$, as shown below in FIGS. 2B and 2C, respectively) can be used, or a different voltage value selected at a point where the memory cells of the memory array are determined to output their state reliably.

By way of example, one byte of memory cells, each capable of storing 1 bit of data, can be programmed to store an expected pattern of "10100101" (in binary code). Voltage output values generated from one byte storing 10100101b could be 3.3, 0.0, 3.2, 0.1, 0.1, 3.0, 0.5, and 3.2 Volts (V), respectively, in a flash memory with nominal output voltages of 0.0 and 3.3 Volts for logic 0 and logic 1, respectively. As used herein, a "nominal" output voltage refers to a specified output voltage for a given memory array. For example, cells in a memory array specified to output nominal voltages of 0.0 and 3.3 V might output actual voltages of 0.05 V and 3.35 V. A nominal output voltage is frequently, but not necessarily, the median of output voltages observed for memory cells programmed to output a specified logic level in a memory array. By using a preselected threshold of 0.4 V to generate discrete output values, the one byte of voltage values mentioned in this paragraph would generate an output pattern of 10100111b, where the next to last bit is output as a 1 instead of a 0 (as previously stored) due to a variation in the voltage output value. In some embodiments, a different pre-selected threshold than used to read output values during normal operation can be used. For example, a pre-selected threshold of 0.4 V, instead of a threshold of 0.7 V normally used to determine whether a logic 0 or 1 is stored in a 1-bit memory cell, can be used. In some examples, multiple preselected thresholds can be used to "sweep" the test pattern by measuring voltage output values at multiple thresholds. (For example, threshold voltages $t_1$ and $t_2$ as illustrated in FIG. 2B, below). In some examples, a different threshold voltage is used based on the expected pattern, for example, a different threshold can be used based on whether a memory cell has been programmed with a 0 or a 1. For clarity and convenience of presentation, the examples disclosed in the present application often describe the output of memory cells being measured as an absolute voltage, however, other electrical, magnetic, and optical properties, such as current or charge, or relative or differential measurements based on other electrical, magnetic, and optical properties, could also be used, as would be readily discernable to one of ordinary skill in the art.

At process block 120, the output values are compared to expected output values based on the expected pattern. If discrete output values were generated at process block 110, then the output values are compared to nominal discrete output values based on the previously programmed expected pattern. For example, if the output values generated at process block 110 were 1011b and the expected pattern was previously programmed as 1001b, then an unexpected difference between the generated and previously programmed pattern is determined as a result of the comparison. If continuous output values were generated at process block 110, then the output values are compared to nominal continuous output values based on the previously programmed expected pattern. For example, for an expected pattern of 1001b, continuous output values of 3.25, 0.1, 0.3, and 3.1 V could be generated. Using a nominal output threshold value of 0.2 V to determine whether the output value corresponds to a 0 or a 1, output values would be converted to 1011b. In some examples, multiple thresholds can be used for multi-bit cells, or to generate bits indicating indeterminate output. For example, using 0.2 V and 3.2 V as the logic 0 and 1 thresholds, respectively, the output values could be converted to "10XX," where the Xs indicate indeterminate output values (e.g., values between the thresholds of 0.2 and 3.2 V). In the previous two examples using continuous output values, an unexpected difference between the generated and previously programmed is determined as a result of the comparison.

At process block 130, based on the comparison of the output values and the expected output values performed at process block 120, a second set of memory cells is programmed to store data in a second set of memory cells. For example, if the comparison indicates that the output values vary from the expected output values by more than a pre-selected threshold, then the second set of memory cells is reprogrammed to refresh the data stored in the second set of memory cells. In some examples, different voltage thresholds are used, based on the type of data being stored. For example, a voltage threshold closer to the nominal output voltage is used for computer-executable code stored in the second set of memory cells, while a voltage threshold further from the nominal output voltage is used for less critical data that can tolerate more errors, such as audio or video data. In some examples, the data is already stored in the second set of memory cells, and the cells are reprogrammed in order to refresh the memory cells such that the data stored in the memory cells will be retained for a longer time period. In some examples, the data stored in the second set of memory cells is copied to a different memory (e.g., an SRAM coupled to a memory controller), the second set of memory cells is erased, and data is copied from the different memory to the second set of cells by reprogramming the second set of cells. In other examples, the memory cells in the second set are reprogrammed in situ by adjusting the charge level used to program the device. Such approaches where data originating in the second set of cell remains after reprogramming can be referred to as "in-place refresh."

In some examples, the data to be programmed is already stored in another set of memory cells that is different than the second set of memory cells. For example, data stored in a third set of cells can be copied directly to the second set of memory cells without the need to temporarily copy the data to a different memory (e.g., an SRAM coupled to a memory controller). Such approaches where the data is moved to a different set of non-volatile memory cells during reprogramming can be referred to as "out-of-place refresh."

It should be noted that the data moved during an out-of-place refresh need not be directly addressable to consumers of the data (e.g., entities or devices that receive the data from the memory array, such as applications, operating systems, filesystems, or other data consumers). For example, a non-volatile storage device can provide a logical address to such consumers, and provide transparent mapping of logical addresses to physical addresses in non-volatile memory using mapping tables. In other examples, a non-volatile storage device provides data as a file or stream of data. Example approaches to such mappings are discussed below regarding FIGS. 5 and 6. Example implementations of the approach outlined in FIG. 1 are described in further detail below regarding FIG. 7.

Example Output Values, Data Patterns, and Metadata

Figure 2B:
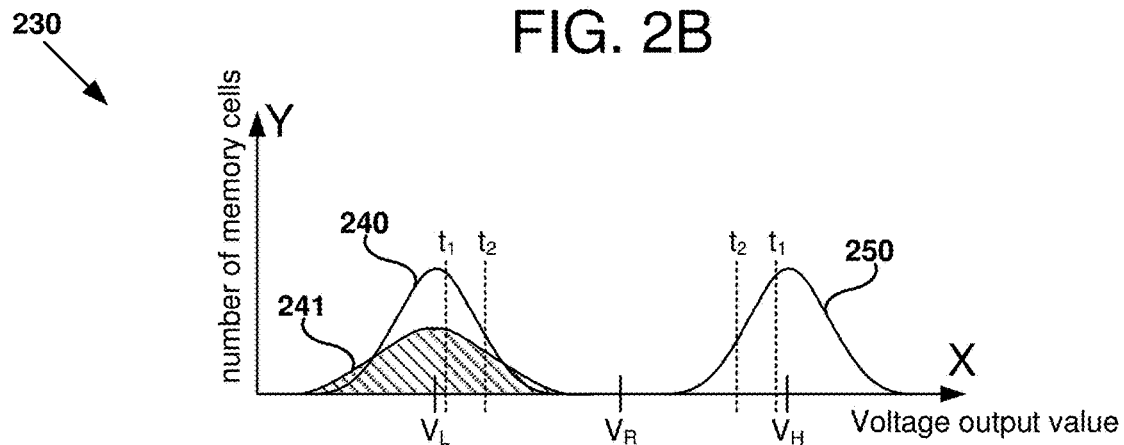
FIG. 2B is a generalized histogram illustrating voltage output levels in a memory array of 1-bit non-volatile memory cells.
Figure 2C:
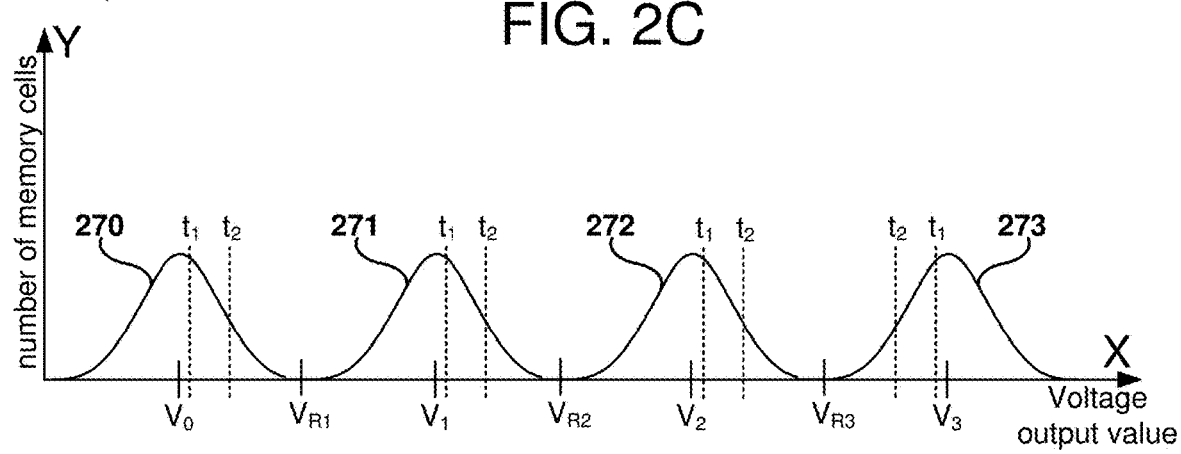
FIG. 2C is a generalized histogram illustrating voltage output levels in an array of 2-bit non-volatile memory cells.

FIGS. 2B and 2C are charts 230 and 260 illustrating generalized histograms for distributions of flash memory cells having particular voltage output levels. Typical flash memory cells store data by applying varying levels of electrical charge to a floating-gate transistor in a memory cell. When a flash memory cell is programmed, the threshold voltage of the cell varies based on the amount of charge stored in the cell. The threshold voltage of the cell can then be measured based on, for example, measuring an output voltage or current for the cell. In typical use of an array of 1-bit flash memory cells, all or a portion of the cells are first erased so that all the cells being erased are set to output a logic 1 (e.g., a high output voltage). Next, individual bits of a memory cell are programmed by adjusting the amount of charge stored by a floating-gate transistor of the memory cell to output a nominal voltage. For multi-level memory cells, the charge can be adjusted to several different levels in order to improve the density of the memory array. However, such multi-level memory cells tend to decay faster, as the margins for producing valid output values is reduced.

As shown in FIG. 2B, a number of cells in a flash memory array are programmed to produce a nominal voltage output level of $V_L$ or $V_H$ and plotted as distribution curves 240 and 250. For example, based on the manufacturing process used, nominal voltage level $V_H$ can be 3.3 V (designated a logic 1) and nominal voltage level $V_L$ can be 0.0 V (designated a logic 0). Due to a number of factors, such as the duration the data has been stored in the cell, manufacturing process variations, number of read/write cycles, temperature, power supply voltage, or other relevant factors, the programmed cells do not always output voltage at precisely $V_L$ or $V_H$, but instead exhibit a distribution of output voltages. Voltage output values are plotted on the X-axis, and the number of memory cells having that value are plotted on the Y-axis for example distribution curves 240 and 250. During a normal memory cell read operation, output voltage values for flash memory cells can be compared to a reference voltage $V_R$, where any output voltage measured below $V_R$ produces a logic 0, and any output voltage measured above $V_R$ produces a logic 1. Also shown is a distribution curve 241, which corresponds to a histogram for a similar voltage output level measurement for the same 0-bit cells, but measured at a later point in time (for example, several months after the measurements that produced distribution curve 240). As shown, the variation in output voltage has increased, and an increased number of cells exhibit output voltages that near threshold voltage $V_R$.

By using an expected pattern of memory cell programming levels and varying the reference voltages used, additional information regarding how reliable programmed values are being stored in memory cells of an array can be determined. For example, by sampling a number of output voltages for memory cells storing an expected pattern of output values at different thresholds (e.g., using an alternative set of threshold voltages $t_1$ and/or $t_2$), an indication of the reliability of states stored in a flash memory can be determined Results for a number of cells storing a test pattern can be extrapolated to apply to non-test pattern data stored in other cells of the flash memory, and this data can also be combined with date information regarding when the expected pattern was programmed, performance specifications for the memory array, and/or other parameters, as described further below.

In some examples, the threshold voltages (e.g., $t_1$ and $t_2$) are adjusted by a user or system firmware. If a non-volatile memory array is being used in an application specifying higher reliability (e.g., storing source code in an embedded system) a narrower voltage threshold ($t_1$) is used. If the memory array is being used in an application specifying lower reliability, a wider voltage threshold ($t_2$) is used. A memory controller can receive instructions and vary the voltage threshold(s) used accordingly. For example, values specifying thresholds $t_1$ and $t_2$ or voltage offsets from a nominal voltage (e.g., $V_L$ or $V_H$) can be stored in programmable registers on the memory storage device. In some examples, the threshold voltage selected for evaluating the output voltages is determined based on the type of data stored in the memory array. For example, the threshold for determining when to reprogram data that is tolerant to a number of errors, such as video or audio data, can be evaluated using narrower voltage thresholds (e.g., voltage thresholds that are closer to a specified nominal voltage) than data that is less tolerant to a number of errors, such as computer-executable instructions.

FIG. 2C is a chart 260 that illustrates a number of distribution curves 270, 271, 272, and 273 for a 2-bit flash memory cell. As shown, four different nominal voltage output levels $V_0$, $V_1$, $V_2$, and $V_3$ can be used to indicate 00b, 01b, 10b, and 11b discrete output states, respectively. During normal read operation of a flash memory cell, three different reference voltages $V_{R1}$, $V_{R2}$, and $V_{R3}$ are used to distinguish between the four discrete output states. Similar to the alternative set of threshold voltages $t_1$ and $t_2$ shown in FIG. 2B, an alternative set of threshold voltages $t_1$ and/or $t_2$ can be used to indicate the reliability of states stored in a flash memory using a previously-stored expected pattern of data.

FIG. 2A is a diagram 200 depicting data stored in a portion of a non-volatile memory array in an example implementation of the disclosed technology as can be used with the method outlined in FIG. 1. Shown are logic values for several 40-bit words 212-217 of data programmed in a non-volatile array 210. Each word has a physical address (e.g., addr0 220) that is used for accessing the word for reading and writing. The diagram 200 includes labeling identifying particular bits of the words. For example, the least significant bit (lsb) is labeled bit 0 and the most significant bit (msb) is labeled bit 39. Each of the six 40-bit words 212-217 shown includes data comprising a test pattern 10b of two bits, arbitrary data of 32 bits, and an error correcting codes (ECC) code of 6 bits, which is a Hamming code generated based on the arbitrary data of 32 bits for each respective word. It should be appreciated that the test pattern 10b is an example, and that ECC codes can be applied to units of arbitrary data larger than 32 bits. The ECC code length tends to grow proportional with the size of the data the ECC code is being applied to and the desired quality of error correction to be provided. Typical arbitrary data sizes include 512 bytes, 2048 bytes, and 4096 bytes of data with an additional 16 bytes, 64 bytes, and 128 bytes, respectively, used for additional ECC and/or test pattern information.

The test pattern "10" is selected such that the state of the memory cells programmed with the test pattern can be evaluated at a later date. In some examples, the test pattern includes at least one bit programmed to each possible discrete state that can be programmed for a memory cell. As shown, the test pattern is not dependent on the arbitrary data bits (bits 6-37) stored in the same word as the test pattern. Thus, when evaluating an output value for the memory cells storing a test pattern, the contents of the arbitrary data and the ECC code is not necessarily considered. However, because the test pattern is predetermined and independent of other data stored in the memory device, the expected output value for the memory cells storing the test pattern are known without the need to first evaluate the memory cells. In some examples, the test patterns comprise series of incremental values, address offsets, or alternating bit patterns (e.g., a byte of all ones followed by a byte of all zeros followed by a byte of all ones, etc.). Test patterns can be determined by circuitry in the memory array or non-volatile memory storage device itself, or be received from another source (e.g., a host computer) and programmed using a memory controller to write the test pattern data to the memory cells.

As shown, the arbitrary data can include dates (for example, word 212 encodes the date Jan. 15, 2009, at 20:31:00 GMT (as hexadecimal 0x496f9d04 in the 32-bit Unix epoch). Also shown are dates Feb. 2, 2011, at 12:25:00 GMT (0x4d494d1c, encoded in word 213) and Sep. 4, 2004, at 21:30 GMT (0x413a33d8, encoded in word 216). These dates can be used in some implementations, for example, to make determinations regarding which data words are to be reprogrammed, which test patterns are to be reprogrammed, and/or other suitable determinations based on the dates. In some examples, dates can be stored in other storage separate from memory arrays that include test patterns. As used herein, the terms "date" and "timestamp" refers to any suitable time-based data for tracking time and/or date. Some examples may only include a portion the date information in the examples above, for example, only a day, month, and year (but no specific time of day data), only a month and a year, only a time of day, or other combination of time and date fields. In other examples, the timestamp represents a number of units of time for which a device has been operating (e.g., a number of seconds or microseconds).

Figure 3A:
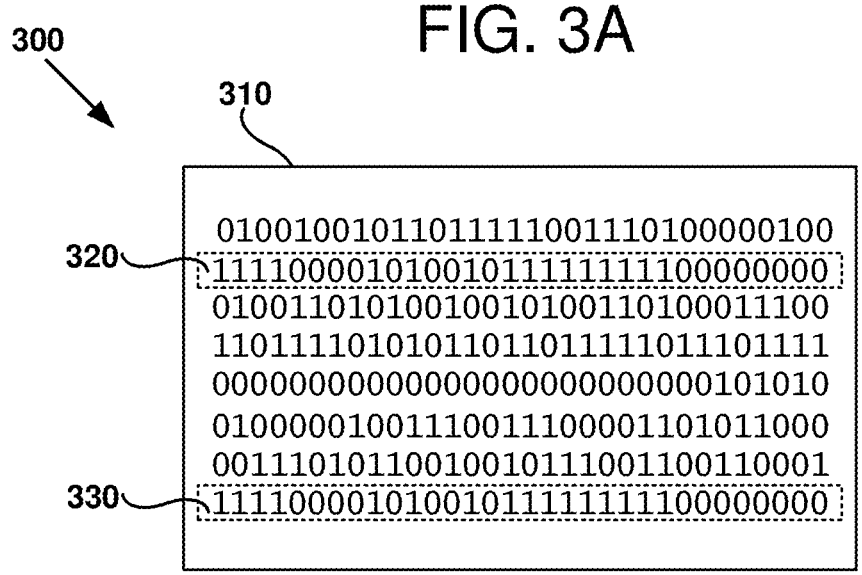
FIG. 3A is a diagram depicting data including test patterns stored in a portion of a 1-bit non-volatile memory in an exemplary implementation of the disclosed technology.

FIG. 3A is a diagram 300 depicting data stored in a portion of a non-volatile memory array 310 in an example implementation of the disclosed technology. As shown, two words 320 and 330 of the 32-bit words stored in the memory include an identical test pattern. These test patterns are included with other words of data stored in the memory data. Thus, the test patterns need not be arranged as bits in the same word that stores data (e.g., as shown in FIG. 2A). One aspect of using word-length test patterns is that the test pattern can improve detection of variations in output levels that are affected by neighboring memory cells. For example, a 0 bit adjacent to a series of several 1 bits may exhibit faster decay in output voltage over time than a 0 bit adjacent to a number of randomly-distributed 0 and 1 bits. Thus, test patterns can be selected that are more sensitive to data integrity issues caused by process variation or other issues affecting the integrity of data stored in a memory cell.

Figure 3B:
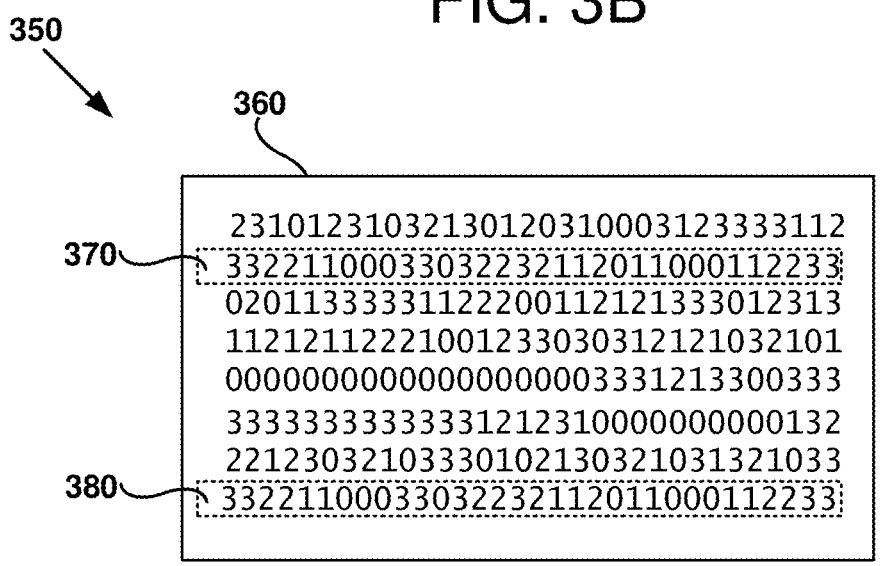
FIG. 3B is a diagram depicting data including test patterns stored in a portion of a 2-bit non-volatile memory in an exemplary implementation of the disclosed technology.

FIG. 3B is a diagram 350 depicting data stored in a portion of a multi-bit non-volatile memory array 360 including 2-bit cells. As shown, each memory cell in the memory array can produce an output values that can be read as a discrete states 0, 1, 2, or 3 (or binary 00b, 01b, 10b, 11b). Also shown are two words 370 and 380 encoding test patterns selected for use in 2-bit cells. As the test patterns include a number of cells programmed to each of the four available states, variation for each logic level can be detected using the test pattern.

Figure 4:
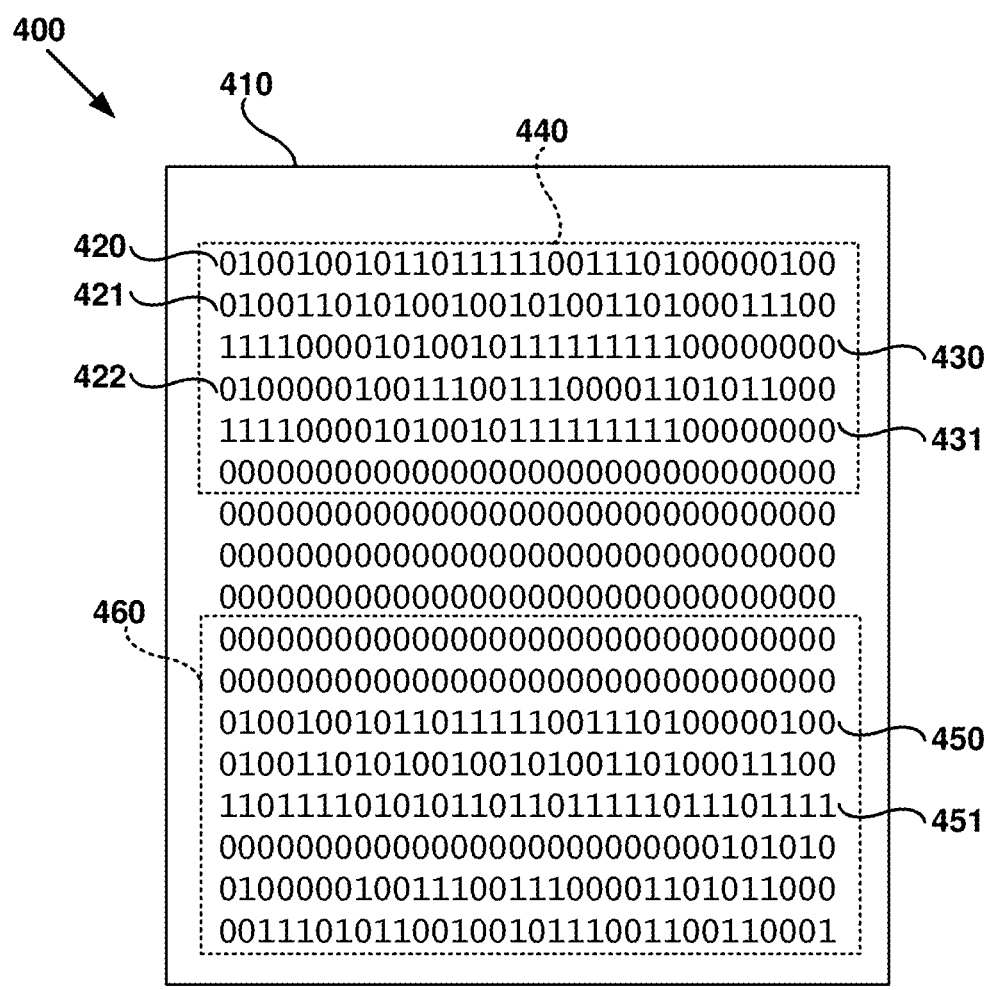
FIG. 4 is a diagram depicting data including test patterns, dates, and unprogrammed memory cells stored in a portion of a 1-bit non-volatile memory in an exemplary implementation of the disclosed technology.

FIG. 4 is a diagram 400 depicting data stored in a portion of a non-volatile memory array 410 using 1-bit cells. As shown, a number of dates (420-422) and test patterns (430 and 431) are stored in a portion 440 of the memory array designated for memory overhead. Also shown are a number of words of data (e.g., data words 450 and 451) that are stored in another portion 460 of the memory array 410 designated for memory overhead. Thus, test patterns, date information, and other data used to determine the integrity of data stored in the memory array can be located in a different portion of the memory than data. Such an arrangement can avoid complications in managing data, test patterns, and date information.

Example Memory Organization

Figure 5:
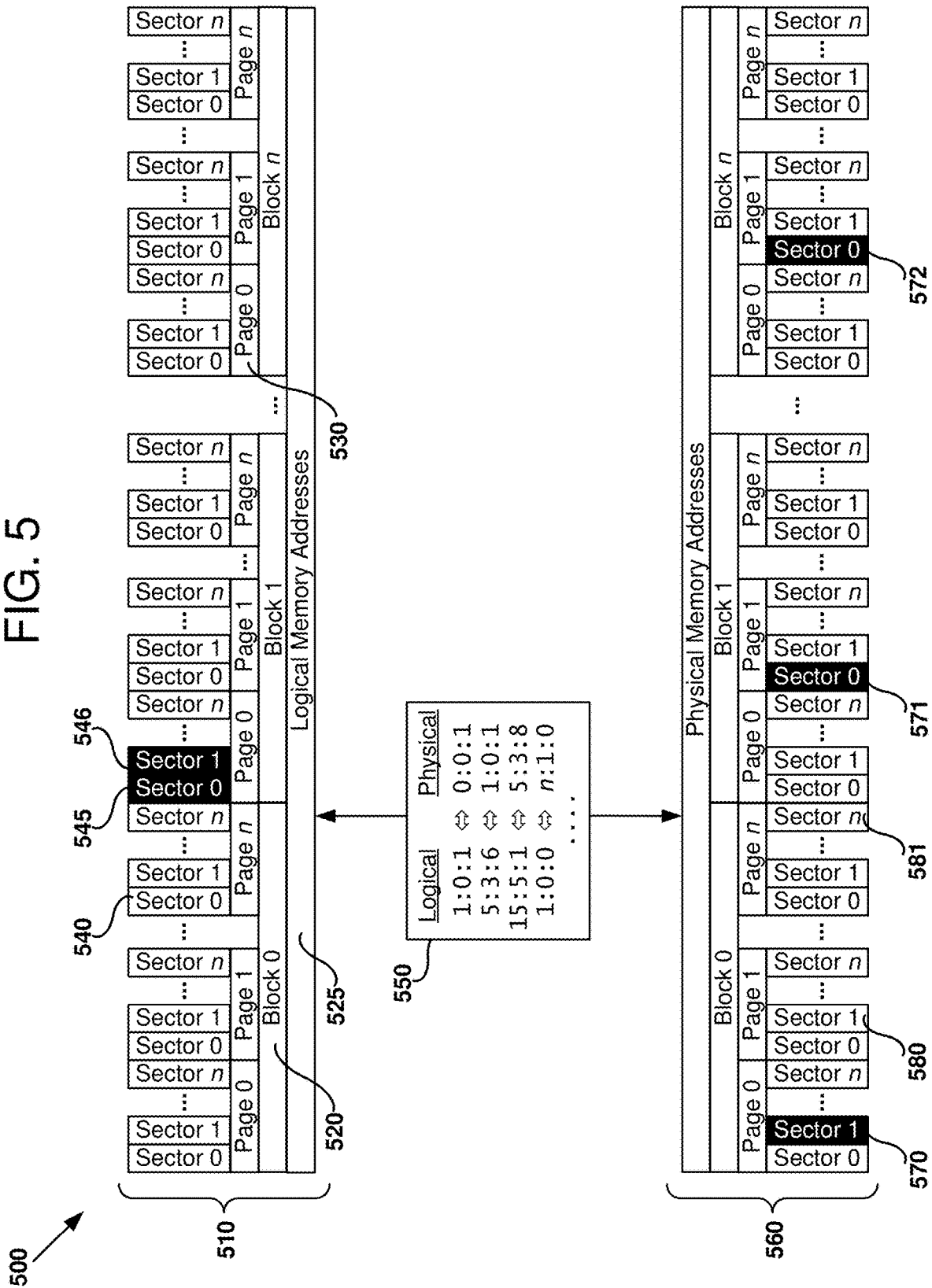
FIG. 5 is a diagram illustrating a memory configuration storing test patterns in an exemplary implementation of the disclosed technology.

FIG. 5 is a diagram 500 illustrating a memory configuration storing test patterns in an exemplary implementation of the disclosed technology. As shown, a logical memory hierarchy 510 includes a number of blocks (e.g., logical memory block 520), which include a number of pages (e.g., logical memory page 530), which in turn include a number of sectors (e.g. logical sector 540). The logical memory hierarchy 510 also includes a number of logical memory addresses 525, which can be used to access data stored in any accessible sector. While most of the data accessible in the logical memory hierarchy 510 is stored in sectors (e.g., sector 540 or 545), in some examples, system data can also be stored in memory designated as belonging to a page (e.g., page 530) or block (e.g., block 520). Two logical sectors 545 and 546 are highlighted to indicate that these sectors are storing test pattern data (e.g., an expected pattern of 0 and 1 bits) to be used for determining data integrity. In some examples, sectors storing test pattern data can include other data, while in other examples, an entire sector is dedicated to storing test pattern data.

Data can be accessed according to the logical memory hierarchy 510 without the data consumer having an indication where in the memory device the data is actually physically stored. In those embodiments, the logical memory hierarchy 510 acts as an abstraction layer for accessing the non-volatile memory hierarchy (e.g., a memory controller or other processor implementing a file system, operating system, application, or other suitable process) without needing to map memory to physical locations within a memory array.

The memory hierarchy diagram 500 also includes a logical/physical mapping table 550 and a physical memory hierarchy 560. The physical memory hierarchy 560 is a representation of how data is arranged according to the physical implementation of a memory array. A logical/physical mapping table 550 provides mapping to the physical memory by looking up mappings of individual sectors and providing data according to the mapping. For example, test pattern data stored at block 1, page 0, sector 1 (sector 546) of the logical memory hierarchy 510 is actually stored at block 0, page 0, sector 1 (sector 570) of the physical memory hierarchy 560.

As shown, those sectors 570-572 storing test pattern data are highlighted, and cells in those sectors can be designated as pattern cells. In this example, the sectors 570-572 for storing test pattern are selected such that each block of the physical memory hierarchy 560 has at least one sector with test pattern data. Thus, blocks can be arranged according to specific hardware implementing a non-volatile memory array (e.g., each block corresponds to a single one of multiple flash memory chips). Memory cells storing data in other sectors (e.g., sectors 580 and 581) do not store test pattern data, and can be designated as data cells. In this way, the accuracy of data lifecycle estimate can be improved by associating data lifecycles with a test pattern stored in the same block (e.g., the same chip or portion thereof), based on the assumption that variations due to manufacturing process, temperature, supply voltage, or other variations, are more likely to be similar within a particular block.

As used herein, a "page" of memory refers to the smallest amount of memory that is independently programmable in a memory hierarchy. A "sector" of memory refers to the smallest amount of memory that can be read using a single sector read operation. A "block" refers to a collection of a number of pages. As will be readily understood by one of ordinary skill in the art, selection of the size and arrangements of sectors, pages, and blocks can be made depending on the underlying memory storage technology, design tradeoffs in performance, power, and product cost between reading, addressing, and programming memory, and other considerations. Thus, the memory hierarchies depicted in FIGS. 5 and 6 are provided for illustrative purposes and are not intended to limit the scope of the present disclosure in any way.

Figure 6:
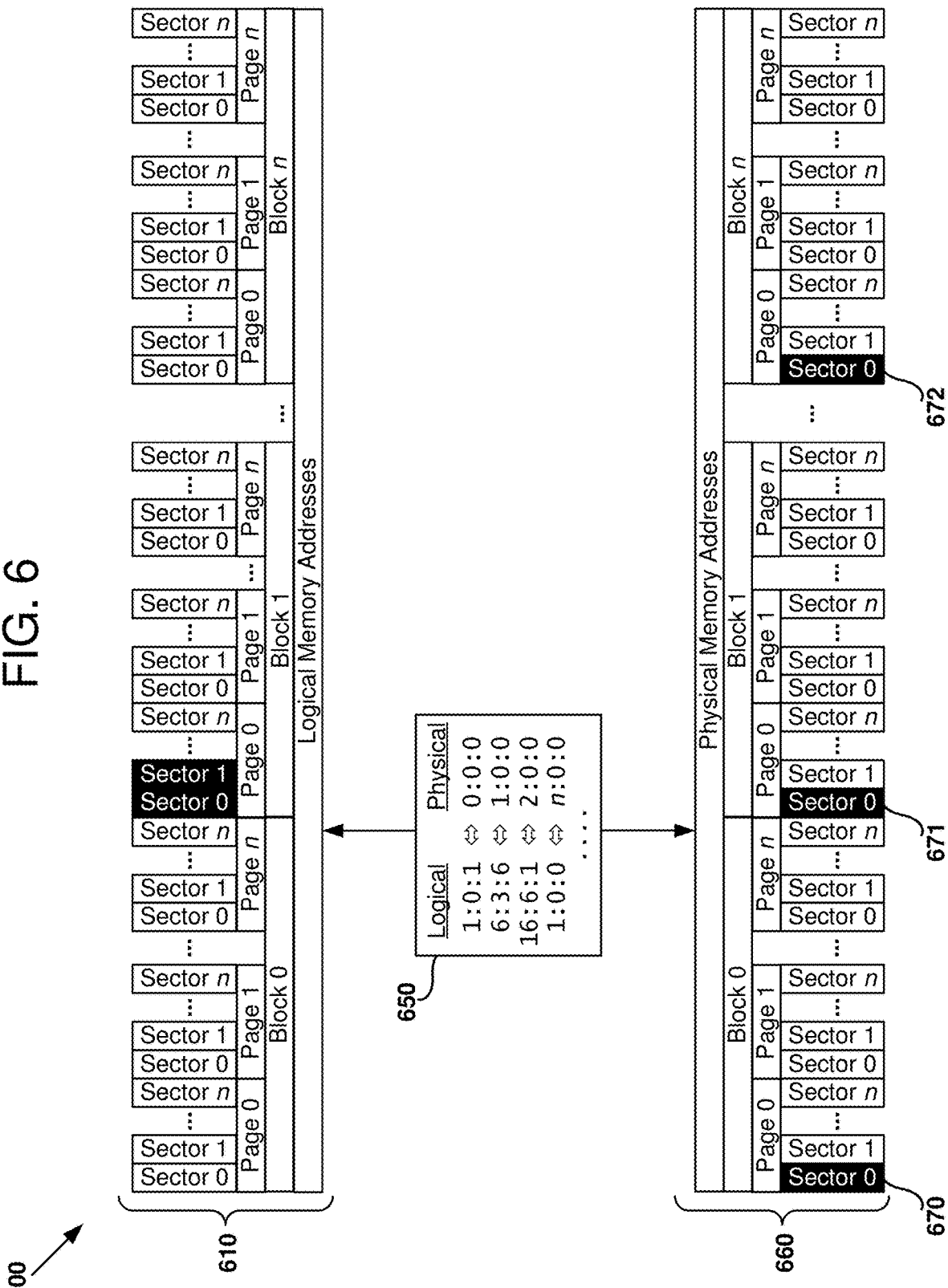
FIG. 6 is a diagram illustrating a memory configuration storing test patterns in an exemplary implementation of the disclosed technology.

FIG. 6 is a diagram 600 illustrating a memory configuration storing test patterns in an exemplary implementation of the disclosed technology, including a logical memory hierarchy 610, a logical/physical mapping table 650, and a physical memory hierarchy 660, which are implemented in a similar fashion to those described above regarding diagram 500 of FIG. 5.

The diagram 600 of FIG. 6 illustrates an alternative technique for arranging the location of physical sectors storing test pattern data (e.g., physical sectors 670-672) in a memory storage device. As shown, each of the highlighted physical sectors is located in an identically addressed respective sector relative to each respective page of the physical memory. Such an arrangement can simplify identification and use of the test pattern data in certain implementations of the disclosed technology. Similar to the approach described regarding FIG. 5, the physical sectors storing test pattern data and non-test pattern data can be accessed using logical memory addresses and a logical/physical mapping table 650.

The types of suitable test patterns are not limited to the examples depicted in FIGS. 2A, 3A, and 3B. In some examples, all or a portion of a memory sector in a memory array can be used as a test pattern, while other memory sectors do not contain any test patterns. In some examples, the test patterns are stored in areas of the memory array designated for maintenance or other overhead bits. Further, test patterns can also be programmed that span multiple words of a sector.

Example Further Detailing Generation of Output Values

Figure 7:
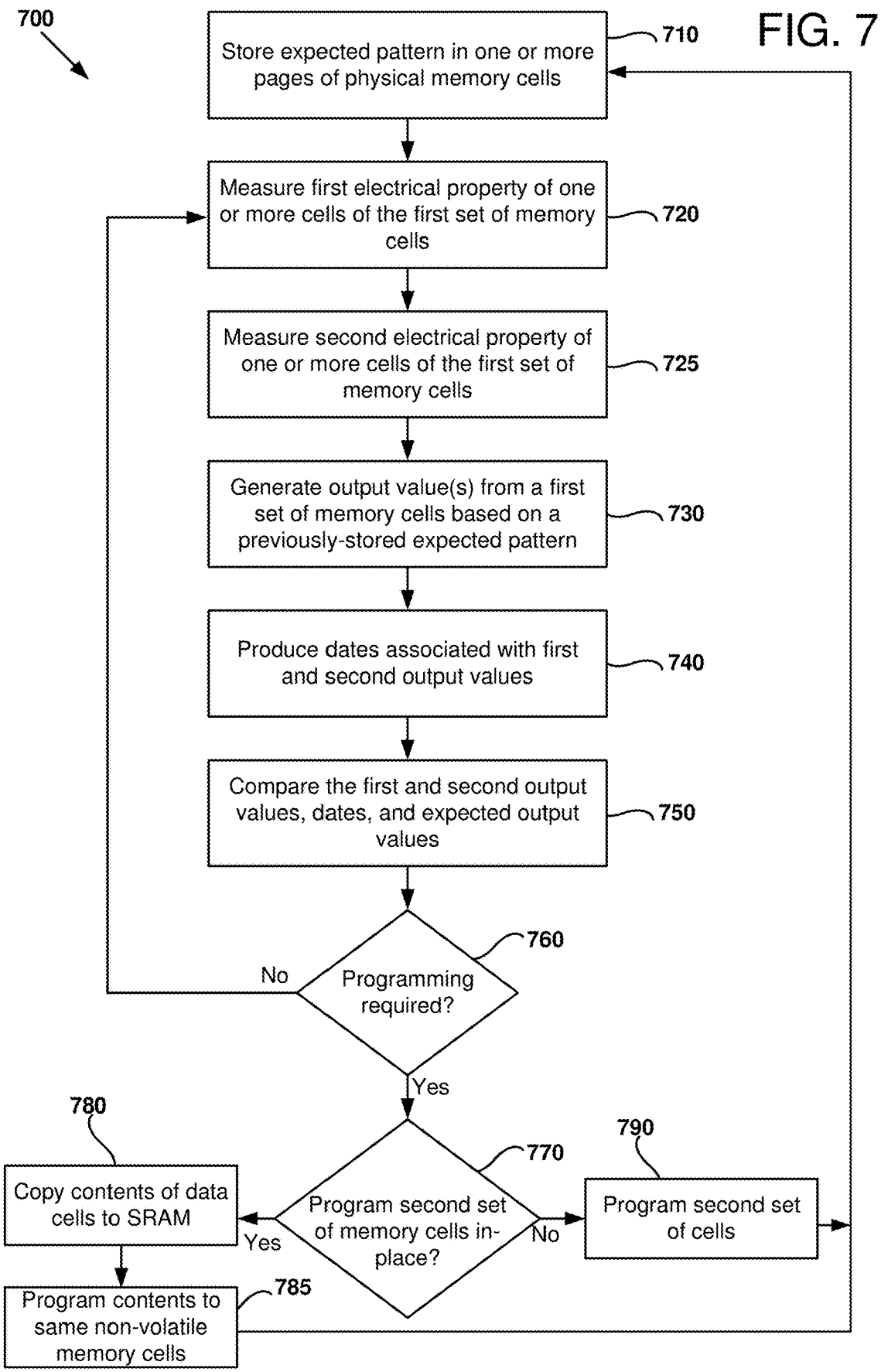
FIG. 7 is a flow chart that further details the example implementation illustrated in FIG. 1.

FIG. 7 is a flow chart 700 of another, more detailed exemplary method of generating output values from a first set of memory cells based on a previously-stored expected pattern and programming a second set of memory cells based on a comparison of the output values and the expected pattern.

At process block 710, an expected pattern of discrete states is stored in one or more pages of physical memory cells of a non-volatile memory array. For example, test patterns similar to those depicted in FIGS. 2A, 3A, 3B, and/or 4 can be stored in a non-volatile memory array, as discussed above. Furthermore, techniques for selecting where an expected pattern is stored in the non-volatile memory can include those discussed above regarding FIGS. 5 and 6. In some examples, the non-volatile memory array is programmed with an expected pattern of discrete states by the non-volatile storage device manufacturer before the device is sold, while in other examples, the expected pattern is programmed at some other point during the lifetime of the device (e.g., by a memory controller executing maintenance routines).

In some examples, additional data, such as metadata representing date information or error correcting codes (ECC) can also be stored in the non-volatile memory array at process block 710. For example, date information indicating when an expected pattern was stored in the memory array can be stored as metadata. In some examples, metadata associated with other data stored in a non-volatile storage device can be stored. In some examples, the storage device includes defined memory locations for storing metadata.

At process block 720, a first electrical property (e.g., an output voltage, an output current, resistance, charge, or other suitable property) is measured for one or more non-volatile memory cells of a first set of memory cells. For example, an output voltage for a memory cell in a first set can be measured at a first point in time using a first set of parameters applied to the memory cells (e.g., supply voltage for the memory array, reference voltage used to determine logic levels, or other suitable parameters). In some examples, a sense amplifier is used to generate voltage output values that are used to generate discrete output values. In some examples, the cells belong to the first set because those cells store the expected pattern. In other examples, date information indicating when the cells were programmed can be used to select cells that belong to the first set (e.g., by selecting only the oldest cells storing the expected pattern).

At process block 725, a second electrical property (e.g., an output voltage, an output current, resistance, charge, or other suitable property) is measured for one or more non-volatile memory cells of the first set of memory cells. For example, an output voltage for a memory cell in a first set can be measured at a second point in time using the same first set of parameters used at process block 720. Hence, the same electrical property (e.g., output voltage) can be measured at two points in time and later compared to determine the rate at which reading data stored in the first set of memory cells is becoming less reliable.

In some examples, data representing one or both of the two electrical properties measured at process blocks 720 and 725 can be stored in a computer-readable storage medium to facilitate comparing the properties. In some examples, the first electrical property can be measured and data representing the property stored by the manufacturer of a non-volatile memory storage device, and the second electrical property can be measured at a later date (e.g., on the order of months or years later).

In some examples, a second, different set of one or more parameters can be applied to the memory cells (e.g., supply voltage for the memory array, reference voltage used to determine logic levels, or other suitable parameters). For example, two different reference voltages or power supply voltages can be used to determine voltage output levels during a relatively short period of time (e.g., on the order of seconds, minutes, or hours) to improve measurements of the stability of data stored in the first set of cells. For example, using two different threshold voltages $t_1$ and $t_2$, as shown in FIG. 2B, is an example of two different reference voltages that could be used. In some examples, the two electrical properties can be compared in a linear fashion, while in other examples, the properties are compared using a logarithmic scale, or a nonlinear scale. In some examples, two different types of parameters (e.g., supply voltage and reference voltage) and/or two different electrical properties (e.g., output voltage and current) are varied for the measurements at process blocks 720 and 725. In some examples, only a single electrical property is measured, and the act of measuring depicted at process block 725 is not performed.

At process block 730, one or more output values are generated for the first set of memory cells based on an expected pattern that was stored in the first set of memory cells at process block 710. For example, a simple pass-fail indication, indication of zero or more failing bits of the expected pattern, or a pattern of discrete states (based on the measurements made at process blocks 720 and/or 725) can be generated as the output values. The expected pattern used to base the output values can be received from, for example, data stored in a non-volatile storage device, received from a host computer system coupled to a non-volatile storage device, or stored as a number of computer-executable instructions for execution by a memory controller that generates the output values. Hence, the expected pattern does not need to be based on data stored in the first set of memory cells, but can be predetermined independently of data stored in the first set of memory cells. In some examples, the output values are discrete states (e.g., logic 1 or 0) while in other examples, the output values are continuous values (e.g., expressed in Volts, Amperes, or Coulombs).

At process block 740 additional metadata (e.g., date information or ECC data) is produced and can be used to compare the output values at process block 750. For example, data information indicating the current date, date that the expected pattern was stored, and/or the date that the measurements at process block 720 and/or 725 were made, can be used. In some examples, the date information is stored in one or more memory cells of a non-volatile memory array included in a non-volatile storage device (e.g., the memory array including the first set of cells, or another memory array). In some examples, date information can be produced by receiving date information from a host computer coupled to a non-volatile storage device. In some examples, date information is produced using a real-time clock coupled to the non-volatile storage device. In some examples the real-time clock is a part of the memory controller, or is included in the same housing as other components of the non-volatile storage device. In other examples, elapsed time information is produced using a monotonic clock that increments time information periodically while the non-volatile storage device is operational and which is coupled to the non-volatile storage device. For high-reliability, "always on" applications, a time duration for reprogramming flash memory can be computed from an accumulated time generated using a monotonic clock. Thus, memory blocks can be traversed and selected for reprogramming based on exceeding a threshold, such as a predefined data persistence time or voltage output level. Metadata (e.g., date information, ECC codes, and information describing the type or format of the underlying information stored (e.g., audio, video, or other types of data) can be stored on a per-block or per-page basis, or performed for an entire memory array or partition.

The use of date information can be used to further improve the accuracy of reliability estimates based on the measured electrical properties. At process block 750, first and second output values measured at process block 720 and 725, output values generated at process block 730, and date information produced at process block 740, are compared to produce a result determining whether all or a portion of memory cells in a non-volatile storage device should be reprogrammed. In some examples, the determination is made as a simple reprogram/do not reprogram indication for an entire memory array or an entire storage device (including multiple memory arrays). In further examples, the determination can be made for a range of physical memory addresses (e.g., all memory cells in a page or block of memory), logical memory addresses, or for a number of memory locations based on a date associated with a memory locations (e.g., all memory pages that were programmed more than 2 years ago, or all memory blocks programmed within 6 months of when the expected pattern was stored in non-volatile memory storage).

At process block 760, if an indication to reprogram memory cells is determined, then the method proceeds to process block 770. If a determination that no reprogramming is needed is made, then the method can proceed to process block 720 to make additional measurements.

At process block 770, a determination is made whether to reprogram memory cells of the non-volatile storage device using an "in-place" or "out-of-place" technique. This determination can be made using, for example, a memory controller of a non-volatile storage device or by a host computer coupled to a non-volatile storage device. It should be noted that the memory cells to be reprogrammed do not necessarily include the memory cells storing the expected pattern that was stored at process block 710. In some examples, the memory cells to be reprogrammed is stored in the same sector, page, or block of memory as the expected pattern, while in other examples, the cells to reprogrammed are stored in different sectors, pages, or blocks.

If the in-place technique is selected, the method proceeds to process block 780, and data from memory cells to be reprogrammed is copied to another location (e.g., by storing the data in an SRAM coupled to a non-volatile storage device, a DRAM coupled to a host computer coupled to the non-volatile storage device, or in other memory cells in non-volatile memory of the non-volatile storage device).

At process block 785, at least a portion of the data copied at process block 780 is reprogrammed to the original non-volatile memory cells to be reprogrammed. In some examples, a page or block of non-volatile memory is reprogrammed. In other examples, only specific cells are reprogrammed. In some examples, all cells of a page or block being reprogrammed are erased to a specified logic value (e.g., a logic 1) and then specific bits are programmed to a different logic level (e.g., a logic 0). In some examples, cells can be reprogrammed without being erased by adjusting the amount of charge stored in the cells to reflect a nominal amount of charge for the desired programmed state. In some examples, date information associated with the data to be reprogrammed is also stored (e.g., in designated date locations in non-volatile storage, which can be user and/or host system accessible, or in designated maintenance areas, which can have access limited to the memory controller, but not to a user and/or host system coupled to the non-volatile storage device).

After the copied contents have been programmed at process block 785, the method can then proceed to process block 710 in order to reprogram an expected pattern and/or metadata (such as date information) in one more pages of physical memory cells in a non-volatile storage device (in some examples, program date information associated with the expected pattern is also stored). In other examples, the expected pattern is not reprogrammed, and the method proceeds to process block 720, where measurements are made using a previously-programmed expected pattern.

If instead an out-of-place technique is selected at process block 770, the method proceeds to process block 790, during which data from the cells to be reprogrammed are copied to a different, second set of memory cells of a non-volatile storage device. Hence, the data contents do not need to be copied to a temporary location (e.g., an SRAM coupled to a memory controller) as with the in-place techniques outlined regarding process blocks 780 and 785. In some examples, the logical addresses used to access the refreshed data can be identical to those used before reprogramming, by updating a lookup table used to map logical addresses to the physical addresses where the reprogrammed data is stored. In some examples, date information associated with the newly-programmed cells is also stored. After the second set of cells is reprogrammed, the method can proceed to process block 710 to program an expected states pattern, or proceed to process block 720 to measure electrical properties without reprogramming an expected states pattern, in a similar fashion to that discussed above regarding process block 785.

Example of Servicing Memory Device

Figure 8:
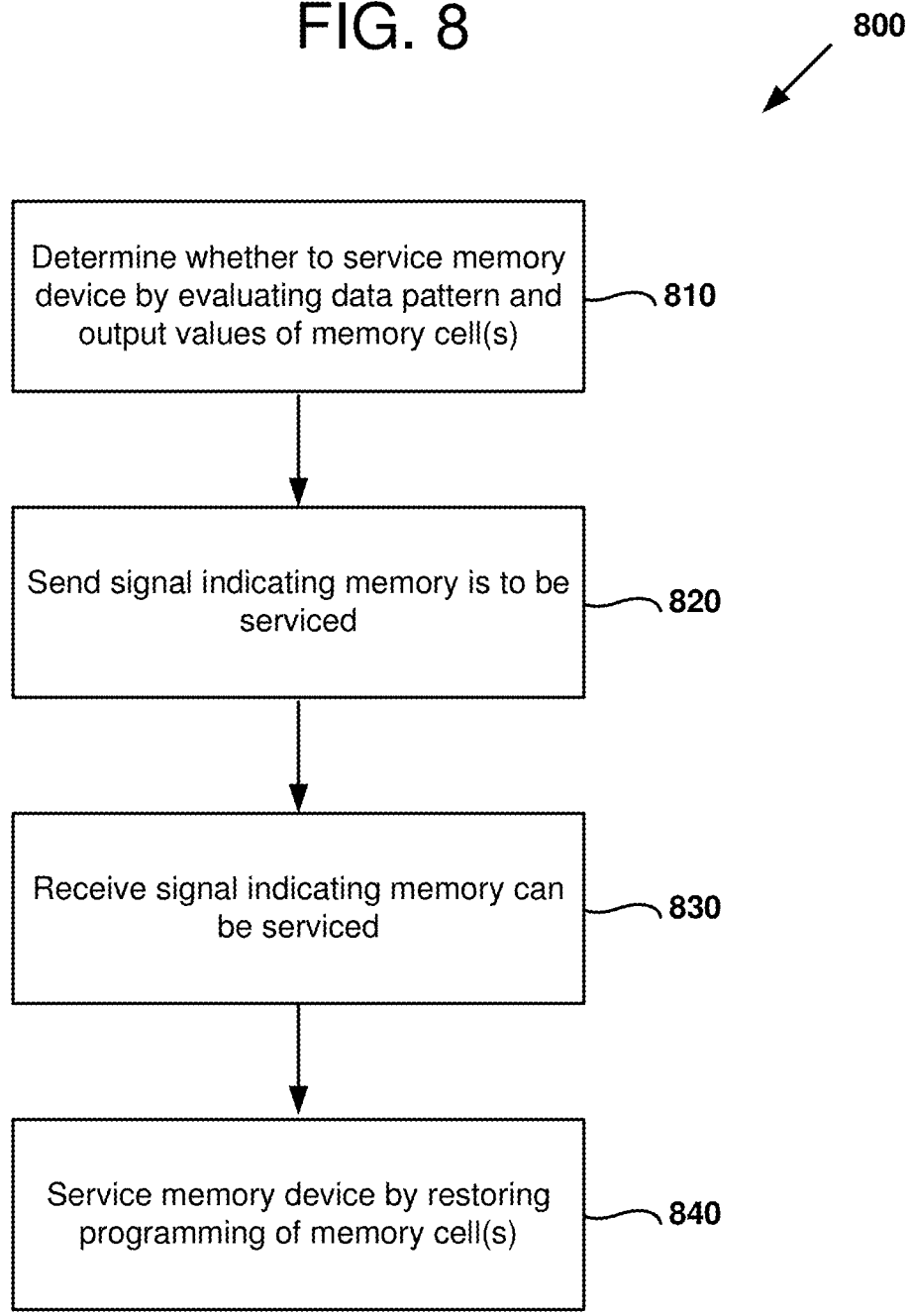
FIG. 8 is a flow chart that outlines an example implementation of the disclosed technology.

FIG. 8 is a flow chart 800 that outlines an exemplary method of servicing a memory device, including communicating with a host device to indicate a need to service the device before servicing as outlined in FIG. 1. For example, a non-volatile storage device including non-volatile memory and a memory control can send and receive signals with a host computer coupled to the non-volatile storage device using a hardware interface. An example configuration for use in performing the method outlined in FIG. 8 is described below regarding FIG. 10.

At process block 810, a determination is made as to whether to service a memory device in a non-volatile storage device by evaluating a data pattern and one or more output values of cells of non-volatile memory that have been programmed with the data pattern. Suitable techniques for determining whether one or more memory cells of a memory device should be serviced are described above regarding FIGS. 1 and 7. For example, the determination can be based on comparing an output voltage for one or more memory cells to a reference voltage and predetermined data pattern. In some examples, additional information such as date information associated with the data pattern, date information associated with data stored in non-volatile memory, time elapsed since last programming, operating conditions or parameters, system- or user-defined parameters, or other suitable information can be used in the determination. In some implementations, the determination is made at pre-defined times, for example, upon reboot of a host system, mounting/dismounting a filesystem stored on a non-volatile storage device, at a periodic time, or other suitable times. In some examples, a signal from a host system coupled to a non-storage device is sent to the storage device indicating the determination to service the storage device based on a user request, system request, or other suitable event. If a determination to service the non-volatile memory is made, the method proceeds to process block 820.

At process block 820, a signal is sent to a host system coupled to the non-volatile storage device indicating that one or more portions of non-volatile memory are to be serviced. For example, a hardware interrupt (e.g., a Universal Serial Bus (USB) interrupt) can be transmitted to the host system using a hardware interface (e.g., a USB interface). Thus, by providing an indication to the host system, the host can receive the signal and prepare for the non-volatile storage device to be serviced by, for example, closing open filehandles, suspending computing processes, or performing other suitable functions. In some examples, additional information such as logical or physical addresses of the memory to be serviced, filenames, or other information can be included with the signal so that the host can initiate servicing functions based on the additional information. For example, only certain pages, blocks, or files stored in non-volatile memory may need to be inaccessible during servicing. The storage device can use other techniques to send a signal to a host controller indicating the need to initiate servicing functions on the memory, for example, by reading a hardware register value that a host controller periodically scans, or by reading a predefined bit pattern from a memory test pattern area, shown in FIG. 2A.

At process block 830, a signal is received indicating that the non-volatile memory can be safely serviced. For example, a host system coupled to the non-volatile storage device can send a signal to a coupled non-volatile storage device indicating that appropriate actions have occurred that would allow the storage device to be safely taken offline by placing the device in a safe state. Further, by sending such a signal, the host system indicates that additional read and/or write requests will be suspending for a period of time (e.g., until receiving a signal from the storage device that servicing is complete). After receiving the signal, the method proceeds to process block 840 to being servicing the memory storage device, by, for example initiating service using a memory controller.

At process block 840, all or a portion of memory devices in a non-volatile storage device are serviced to restore programming of one or more cells of the memory device. For example, the storage device can be placed in a safe mode, and all or a portion of a memory page can be erased and reprogrammed to refresh data stored in memory device (e.g., using in-place or out-of-place refresh, as described above). When in the safe mode, operations that change data, metadata, and/or system information can be prevented from executing to prevent interference with device reprogramming.

Example Further Detailing Servicing of a Memory Device

Figure 9:
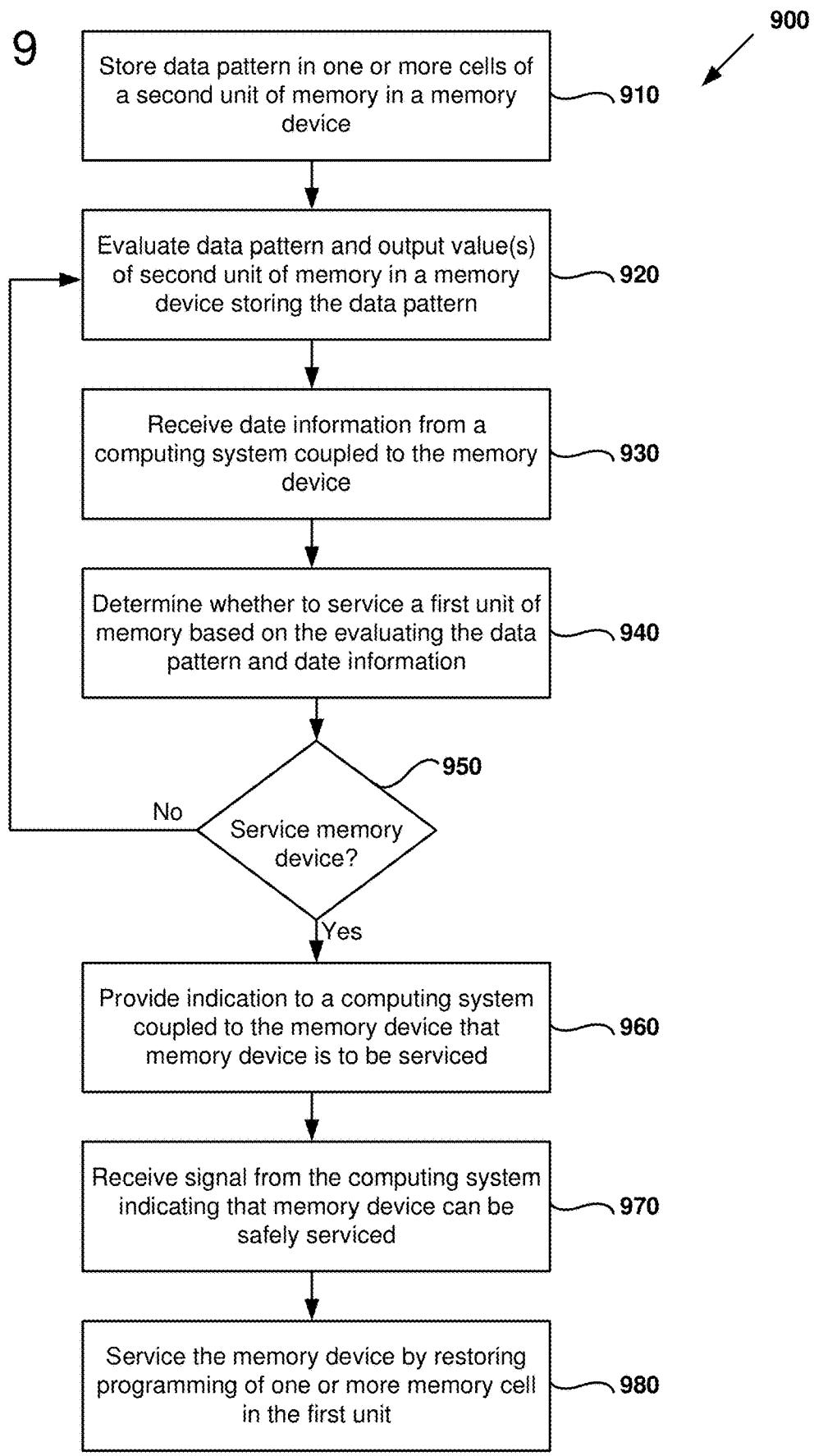
FIG. 9 is a flow chart that further details the example implementation illustrated in FIG. 8.

FIG. 9 is a flow chart 900 of another, more detailed exemplary method of servicing a non-volatile memory device coupled with a host device as outlined in FIG. 8. As described further below, the servicing comprises restoring programming for memory cells storing data in a first unit of memory cells. The unit can be a sector, page, block, or other suitable portion of memory in a non-volatile memory device. The servicing further comprises storing a data pattern in a second unit of memory cells. By comparing output voltages for the data pattern memory cells to nominal output values based on the data pattern, a determination can be made whether to restore programming for the first unit of memory cells storing the data At process block 910, a data pattern is stored in one or more cells of a second unit of memory in a non-volatile storage device. For example, a unit of memory can be a sector, page, block, or other suitable unit of memory for storage of the data pattern. Exemplary descriptions of suitable data patterns are described above regarding FIGS. 2A, 3A, 3B, and 4-6, and detailed examples of methods comprising generating and storing a data pattern are described above regarding FIGS. 1 and 7-8.

At process block 920, the data pattern and output values of the second unit of memory are evaluated. For example, voltage output levels can be compared to the data pattern to determine if the data pattern and the output of the memory unit storing the data pattern are identical.

At process block 930, date information is received from a host computing system coupled to the non-volatile storage device. For example, the host computing system can transmit date and time information based on a clock of the host system. In some examples, the date information can be received from a real-time clock of the memory storage device, in addition to, or in lieu of receiving date information from the host system. In other examples, elapsed time information can be received from a monotonic clock on the memory storage device, in addition to, or in lieu of, receiving date information from the host system.

At process block 940, a determination is made whether to service the non-volatile memory storage device (e.g., by reprogramming cells in one or more memory arrays of the device) based on the data pattern, output values, and date information. For example, if an output voltage level of a cell storing a portion of the data pattern is calculated to be nearing an unreliable storage state, a determination to reprogram all or a portion of the memory arrays is made. In some examples, data associated with the data pattern, or the data pattern itself, are determined to be in need of servicing.

At process block 950, the method checks the determination made at process block 940, and if the device is not determined to need servicing, proceeds to process block 920. If one or more memory arrays of the device are determined to need servicing, the method proceeds to process block 960.

At process block 960, an indication is provided that the memory storage device is to be serviced. In some examples, the indication is provided by sending a signal to the host system (e.g., by transmitting a data value to the host system). In some examples, an interrupt mechanism of a hardware interface can be used to send such a signal to the host system. In some examples, the indication is provided by storing a value in a designated memory location, which can be polled by a host system coupled to the memory storage device. By providing an indication to the host system, the host can receive the signal and prepare for the non-volatile storage device to be serviced without interfering with the normal operation of the host system. In some examples, additional information can be included in the signal so that the host can initiate servicing functions based on the additional information. For example, only certain pages, blocks, or files stored in non-volatile memory may need to be inaccessible during servicing. In some examples, the device may set a hardware state value which a host computing system scans periodically or upon boot to determine that storage maintenance needs to be performed.

At process block 970, a signal is received indicating that the non-volatile memory can be safely serviced. For example, the host computing system can send a signal to the non-volatile storage device indicating that the storage device to be safely taken offline. Further, by sending such a signal, the host system indicates that additional read and/or write requests will be suspending for a period of time.

At process block 980, all or a portion of memory devices in a non-volatile storage device are serviced to restore programming of a first unit of one or more cells of the memory device. For example, the storage device can be placed in a safe mode (e.g., an inaccessible state, where operations such as memory writes or memory reads, which would interfere with programming the memory cells, are prevented from occurring with, for example, a memory controller), and all or a portion of a memory page storing data can be erased and reprogrammed to refresh data stored in memory device (e.g., using in-place or out-of-place refresh, as described above). When in the safe mode, operations that change data, metadata, and/or system information can be prevented from executing to prevent interference with device reprogramming. In some examples, the first unit of memory includes the second unit of memory (storing the data pattern), while in other examples, the first unit of memory and the second unit of memory occupy different locations in non-volatile memory of the storage device.

In some examples, portions of the methods outlined in the flow charts 100, 700, 800, and/or 900 can be performed using a combination of one or more of the following components: a flash programming tool (e.g., used by the manufacturer of a non-volatile storage device), a memory controller (e.g., in a non-volatile storage device including a microcontroller), or a host system (e.g., using a hardware driver or other computer-executable instructions executable on a server, a personal computer, and embedded system, or smart phone coupled to the non-volatile storage device).

FIG. 10 is a block diagram 1000 illustrating a non-volatile storage device 1010 coupled to a host computing system 1090 as can be used in examples of the methods disclosed herein (e.g., the methods depicted in FIGS. 1, 7, 8, and 9). The non-volatile storage device 1010 includes a memory controller 1020, non-volatile memory array 1030, SRAM (Static Random Access Memory) 1040, and hardware interface 1050. The host computing system 1090 can be any suitable computing device that can be coupled to the non-volatile storage device 1010, for example, a host PC, mobile device, smart phone, or other suitable device. Different configurations of the non-volatile storage device 1010 can be configured for use in removable USB storage devices, solid-state drives (e.g., solid-state drives in the housing of the host computing system 1090), embedded systems, or other suitable configurations.

As shown, the memory controller 1020 is coupled to the non-volatile memory array 1030, SRAM 1040, and hardware interface 1050. In other examples register files, DRAM, or other suitable memory technology can be used to perform the functions of SRAM 1040. The memory controller 1020 can be implemented as, for example, a general-purpose microprocessor, a microcontroller, or digital logic and other circuitry for performing the techniques disclosed herein. Selection of appropriate hardware and software for implementing the memory controller can be based on memory storage, memory bandwidth, reliability, power, or other specifications. As shown, the memory controller includes a programming circuit 1022 coupled to the non-volatile memory array 1030 for erasing, programming, and re-programming memory cells in the non-volatile memory array. In some examples, the programming circuitry includes appropriate power supplies for generating appropriate programming voltages and circuitry for addressing the selected portions of the non-volatile memory array to be programmed.

The memory controller 1020 also includes a memory interface 1024 for reading data stored in the non-volatile memory array and reading and writing data stored in the SRAM. In some examples, the memory interface 1024 includes one or more of sense amplifiers, comparators, analog-to-digital (ADC), digital-to-analog (DAC), or other circuitry for generating output values from memory cells in the memory array 1030. In some examples, the memory interface 1024 produces discrete logic values for use by the memory controller 1020, while in other examples, the memory interface 1024 can produce continuous values (e.g., voltage output levels, expresses as an analog signal or a digital representation of the voltage output level) for use by the memory controller.

Another component of the memory controller 1020 is a processing unit 1026, which can be a general-purpose processor, microcontroller, or other suitable processor or logic for controlling operation of the programming circuit 1022 and memory interface 1024. The processing unit 1026 is also coupled to a hardware interface 1050 for sending and receiving instructions and data to and from the host computing system 1090. The memory controller 1020 also includes a real-time clock 1028 for producing date information used in evaluating output values and for storing date information in the non-volatile memory array 1030 and/or SRAM 1040. In some examples, the real-time clock 1028 can be powered (e.g., using a battery) when the non-volatile storage device is offline or unpowered in order to maintain accurate time and date information. In other examples, the real-time clock 1028 is initialized when the storage device 1010 is powered on using, for example, date information received from the host system 1090. In other examples, the real-time clock 1028 is a monotonic clock that increments a time variable periodically when the device 1010 is powered on. For high-reliability systems, tracking elapsed time using a monotonic clock is nearly equivalent to the actual elapsed time for a system in continuous service. In other examples, the real-time clock 1028 is a monotonic clock that is initialized when the device 1010 is powered on using information received from the host system 1090.

The hardware interface 1050 is operable to send instructions and data between the storage device 1010 and host computer system 1090. Examples of suitable hardware interfaces include implementations of USB, CFI (Common Flash memory Interface), Parallel ATA, SATA (Serial ATA), SCSI, eSATA, Ethernet, IEEE 1394, or other suitable hardware interface standards. The hardware interface need not require a mechanical electrical connection. For instance, the hardware interface can be implemented using a suitable wireless standard, such as IEEE 802.11b, 802.11g, 802.11n, or a Bluetooth interface.

Figure 11:
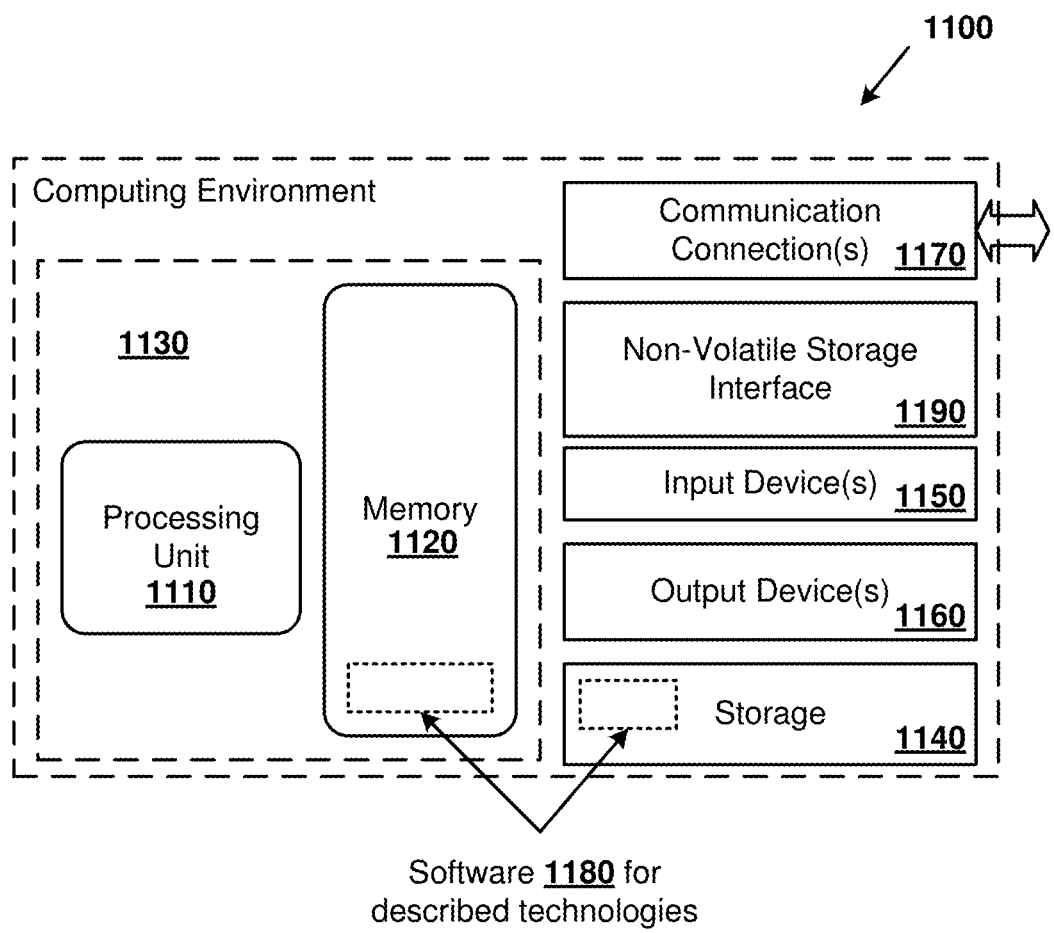
FIG. 11 is a block diagram that illustrates a generalized example of a suitable computing environment in which described embodiments, techniques, and technologies can be implemented.

FIG. 11 illustrates a generalized example of a suitable computing environment 1100 in which described embodiments, techniques, and technologies may be implemented. For example, the computing environment 1100 can implement at least some aspects of a host computer system and/or a non-volatile storage device, as described above.

The computing environment 1100 is not intended to suggest any limitation as to scope of use or functionality of the technology, as the technology may be implemented in diverse general-purpose or special-purpose computing environments. The disclosed technology may also be practiced in distributed computing environments where tasks are performed by remote processing devices that are linked through a communications network. In a distributed computing environment, program modules or instructions may be located in both local and remote memory storage devices.

With reference to FIG. 11, the computing environment 1100 includes at least one central processing unit 1110 and memory 1120. In FIG. 11, this most basic configuration 1130 is included within a dashed line. The central processing unit 1110 executes computer-executable instructions. In a multi-processing system, multiple processing units execute computer-executable instructions to increase processing power and as such, multiple processors can be running simultaneously. The memory 1120 may be non-transitory volatile memory (e.g., registers, cache, RAM), non-transitory non-volatile memory (e.g., ROM, EEPROM, flash memory, etc.), or some combination of the two. The memory 1120 stores software 1180 that can, for example, implement the software embodiments described herein. A computing environment may have additional features. For example, the computing environment 1100 includes storage 1140, one or more input devices 1150, one or more output devices 1160, one or more communication connections 1170, and one or more non-volatile storage device interfaces 1190. An interconnection mechanism (not shown) such as a bus, a controller, or a network, interconnects the components of the computing environment 1100. Typically, operating system software (not shown) provides an operating environment for other software executing in the computing environment 1100, and coordinates activities of the components of the computing environment 1100.

The storage 1140 may be removable or non-removable, and includes magnetic disks, magnetic tapes or cassettes, CD-ROMs, CD-RWs, DVDs, or any other non-transitory storage medium which can be used to store information and that can be accessed within the computing environment 1100. The storage 1140 stores instructions for the software 1180, which can implement technologies described herein.

The input device(s) 1150 may be a touch input device, such as a touch screen, keyboard, keypad, mouse, pen, or trackball, a voice input device, a scanning device, or another device, that provides input to the computing environment 1100. For audio, the input device(s) 1150 may be a sound card or similar device that accepts audio input in analog or digital form. The output device(s) 1160 may be a display, touch screen, printer, speaker, CD- or DVD-writer, or another device that provides output from the computing environment 1100.

The communication connection(s) 1170 enable communication over a communication medium (e.g., a connecting network) to another computing entity. The communication medium conveys information such as computer-executable instructions, compressed graphics information, or other data in a modulated data signal.

Computer-readable media are any available media that can be accessed within a computing environment 1100. By way of example, and not limitation, with the computing environment 1100, computer-readable media include memory 1120 and/or storage 1140. As should be readily understood, the term computer-readable storage media includes non-transitory storage media for data storage such as memory 1120 and storage 1140, and not transmission media such as modulated data signals.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved. The techniques and solutions described in this application can be used in various combinations to provide an improved migration system.

Any of the methods described herein can be performed via one or more computer-readable media (e.g., storage or other tangible media) comprising (e.g., having or storing) computer-executable instructions for performing (e.g., causing a computing device to perform) such methods. Operation can be fully automatic, semi-automatic, or involve manual intervention.

Having described and illustrated the principles of our innovations in the detailed description and accompanying drawings, it will be recognized that the various embodiments can be modified in arrangement and detail without departing from such principles. It should be understood that the programs, processes, or methods described herein are not related or limited to any particular type of computing environment, unless indicated otherwise. Various types of general purpose or specialized computing environments may be used with or perform operations in accordance with the teachings described herein. Elements of embodiments shown in software may be implemented in hardware and vice versa.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims and their equivalents.

I claim:

1. A method for increasing reliability of first data maintained in a first set of memory cells of a memory word, the first set of memory cells comprising non-volatile memory elements, the method comprising:
    storing the first data in the first set of memory cells of the memory word;
    storing test pattern data determined independently of data stored in the first set of memory cells in a second set of memory cells of the same memory word, the second set of memory cells comprising non-volatile memory elements;
    after the storing the first data and the storing the test pattern data, detecting an error in the test pattern data by comparing the stored test pattern data in the second set of memory cells to an expected pattern of discrete states; and
    in response to detecting the error, performing actions, comprising:
        copying the first data to a temporary location, and
        storing the copied first data from the temporary location to a set of memory cells different than the second set of memory cells.

2. The method of claim 1, wherein the storing the copied first data comprises re-programming the first data in the first set of memory cells.

3. The method of claim 1, wherein the storing the copied first data comprises storing the first data in a different set of memory cells than the first set of memory cells.

4. The method of claim 1, wherein the temporary location comprises at least one of: an SRAM device, DRAM device, a cache memory, a memory page buffer, or a memory controller.

5. The method of claim 3, further comprising updating a mapping table to reference the different set of memory cells such that an access request to an address of the first set of memory cells is directed to the different set of memory cells.

6. The method of claim 1, wherein the temporary location comprises a different set of memory cells of the same memory type as the first set of memory cells.

7. The method of claim 1, wherein the temporary location comprises a different set of memory cells of a different memory type as the first set of memory cells.

8. The method of claim 3, further comprising storing at least some data other than the first data in the first set of memory cells to the different set of memory cells when performing the storing the copied first data.

9. The method of claim 1, wherein the detecting an error in the test pattern data comprises comparing output voltage values to a reference voltage value for the test data stored in the second set of memory cells.

10. The method of claim 1, wherein the detecting an error in the test pattern data comprises using a test pattern to detect the error.

11. The method of claim 1, wherein the detecting an error in the test pattern data comprises measuring a plurality of voltage output values of the test data.

12. The method of claim 1, wherein the actions further comprise re-programming the test pattern data.

13. A method for increasing reliability of first data maintained in a first set of memory cells that comprise non-volatile memory elements, the method comprising:
    storing a second timestamp in a second set of memory cells that comprise non-volatile memory elements;
    storing test data in the second set of memory cells;
    detecting an error in the test data; and
    in response to detecting the error, performing actions, comprising:
        reading a first timestamp stored in the first data,
        comparing the first timestamp to the second timestamp, and
        based on a difference between the first timestamp and the second timestamp, re-programming the first data in the first set of memory cells.

14. The method of claim 13, wherein at least one of the first timestamp or the second time stamp is generated using at least one of: a real-time clock, a monotonic clock, a host system clock, or a memory storage device clock.

15. The method of claim 13, wherein at least one of the first timestamp or the second timestamp indicates at least one of: a year, a month, a day, or a number of read/write cycles since the first data was stored in the first set of memory cells.

16. A method for increasing reliability of data stored in a memory, the method comprising:
    storing first data in a first set of non-volatile memory cells of a memory word by accessing the memory with a first physical address;
    storing test data in a second set of non-volatile memory cells of the memory word by accessing the same, first physical address;
    detecting an error in the test data; and
    in response to detecting the error, performing actions, comprising:
        copying the first data to a temporary location, and
        storing the copied first data from the temporary location to a set of memory cells different than the first set of memory cells.

17. The method of claim 1, wherein the non-volatile memory elements are electrically erasable.

18. A memory storage device comprising memory cells modified by performing the method of claim 1, the memory cells comprising at least one of: the first set of memory cells, the second set of memory cells, or the set of memory cells different than the second set of memory cells.

19. A computer-readable storage device storing computer-readable instructions that when executed by a processor coupled to non-volatile memory, cause the processor to perform a method for increasing reliability of first data maintained in a first set of non-volatile memory cells of a memory word in the non-volatile memory, the computer-readable instructions comprising:
  instructions executable to cause the processor to store the first data in the first set of memory cells of the memory word;
  instructions executable to cause the processor to store test pattern data determined independently of data stored in the first set of memory cells in a second set of memory cells of the same memory word, the second set of memory cells comprising non-volatile memory elements;
  instructions executable to cause the processor to, after executing the instructions to store the first data and the instructions to store the test pattern data, detect an error in the test pattern data by comparing the stored test pattern data in the second set of memory cells to an expected pattern of discrete states; and
  instructions executable to cause the processor to, in response to detecting the error, perform operations, the operations comprising:
    copying the first data to a temporary location, and
    storing the copied first data from the temporary location to a set of memory cells different than the second set of memory cells.

20. The computer-readable storage device of claim 19, wherein the computer-readable instructions further comprise instructions executable to cause the processor to store the copied first data comprises re-programming the first data in the first set of memory cells.

21. The computer-readable storage device of claim 19, wherein the computer-readable instructions further comprise instructions executable to cause the processor to store the copied first data comprises storing the first data in a different set of memory cells than the first set of memory cells.

22. The computer-readable storage device of claim 19, wherein the computer-readable instructions further comprise instructions executable to cause the processor to store at least some data other than the first data in the first set of memory cells to the different set of memory cells when performing the storing the copied first data.

23. The computer-readable storage device of claim 19, wherein the operations further comprise re-programming the test pattern data.

24. A computing system comprising a memory controller configured to service a memory device having a non-volatile memory array, the memory controller comprising:
  a programming circuit configured to erase, program, and re-program memory cells in the non-volatile memory array;
  a memory interface for reading data stored in the memory device;
  a processor coupled to the programming circuit and the memory interface, the processor being configured to service the memory device using the programming circuit and the memory interface by:
  storing first data in a first set of memory cells of a memory word in the non-volatile memory array;
  storing test pattern data determined independently of data stored in the first set of memory cells in a second set of memory cells of the same memory word;
  after the storing the first data and the storing the test pattern data, detecting an error in the test pattern data by comparing the stored test pattern data in the second set of memory cells to an expected pattern of discrete states; and
  in response to detecting the error, performing operations, the operations comprising:
    copying the first data to a temporary location, and
    storing the copied first data from the temporary location to a set of memory cells in the non-volatile memory array different than the second set of memory cells.

25. The computing system of claim 24, wherein the temporary location comprises at least one of: an SRAM device, DRAM device, a cache memory, a memory page buffer, or a memory controller.

26. The computing system of claim 24, wherein the processor is further configured to update a mapping table to reference the different set of memory cells such that an access request to an address of the first set of memory cells is directed to the different set of memory cells.

27. The computing system of claim 24, wherein the temporary location comprises a different set of memory cells of the same memory type as the first set of memory cells.

28. The computing system of claim 24, wherein the detecting an error in the test pattern data comprises comparing output voltage values to a reference voltage value for the test data stored in the second set of memory cells.

29. The computing system of claim 24, wherein the detecting an error in the test pattern data comprises measuring a plurality of voltage output values of the test data.

* * * * *